US008830732B2

(12) United States Patent
Liaw

(10) Patent No.: US 8,830,732 B2
(45) Date of Patent: Sep. 9, 2014

(54) SRAM CELL COMPRISING FINFETS

(71) Applicant: Taiwan Semiconductor Manufacturing Company, Ltd., Hsin-Chu (TW)

(72) Inventor: Jhon-Jhy Liaw, Zhodong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 40 days.

(21) Appl. No.: 13/691,373

(22) Filed: Nov. 30, 2012

(65) Prior Publication Data

US 2014/0153322 A1    Jun. 5, 2014

(51) Int. Cl.
*G11C 11/00*    (2006.01)
*G11C 11/412*    (2006.01)
*H01L 27/088*    (2006.01)

(52) U.S. Cl.
CPC .................................. *G11C 11/412* (2013.01); *H01L 27/0886* (2013.01)
USPC ........ 365/156; 365/49.11; 365/154; 365/188; 365/181; 365/189.011; 365/189.15; 365/189.05; 365/202; 365/207

(58) Field of Classification Search
CPC .. H01L 27/11; H01L 27/1104; G11C 11/412; G11C 11/413
USPC ............... 365/49.11, 154, 188, 181, 189.011, 365/189.15, 189.05, 202, 207
See application file for complete search history.

(56) References Cited

U.S. PATENT DOCUMENTS

| 4,623,989 | A | 11/1986 | Blake |
| 6,522,562 | B2 | 2/2003 | Foss |
| 7,250,657 | B2 | 7/2007 | Liaw |
| 7,674,703 | B1 | 3/2010 | Schiwon et al. |
| 8,315,084 | B2 | 11/2012 | Liaw et al. |
| 8,593,890 | B2 | 11/2013 | Adams et al. |
| 2004/0170926 | A1 | 9/2004 | Chandhok |
| 2006/0215441 | A1* | 9/2006 | Matsushige et al. .......... 365/154 |
| 2007/0235765 | A1 | 10/2007 | Liaw |
| 2008/0299780 | A1 | 12/2008 | Elliott et al. |
| 2009/0014798 | A1 | 1/2009 | Zhu et al. |
| 2010/0296334 | A1* | 11/2010 | Houston et al. ............... 365/156 |
| 2011/0222332 | A1* | 9/2011 | Liaw et al. ..................... 365/156 |
| 2012/0147680 | A1 | 6/2012 | Koike |
| 2012/0163068 | A1* | 6/2012 | Houston ....................... 365/156 |

(Continued)

OTHER PUBLICATIONS

Choi, Munkang et al., "14 nm FinFET Stress Engineering with Epitaxial SiGe Source/Drain," International Silicon—Germanium Technology and Device Meeting (ISTDM), Jun. 4-6, 2012, 2 pages.

*Primary Examiner* — Fernando Hidalgo
(74) *Attorney, Agent, or Firm* — Slater and Matsil, L.L.P.

(57) ABSTRACT

A Static Random Access Memory (SRAM) cell includes a first long boundary and a second long boundary parallel to a first direction, and a first short boundary and a second short boundary parallel to a second direction perpendicular to the first direction. The first and the second long boundaries are longer than, and form a rectangle with, the first and the second short boundaries. A CVss line carrying a VSS power supply voltage crosses the first long boundary and the second long boundary. The CVss line is parallel to the second direction. A bit-line and a bit-line bar are on opposite sides of the CVss line. The bit-line and the bit-line bar are configured to carry complementary bit-line signals.

16 Claims, 21 Drawing Sheets

(56) References Cited

U.S. PATENT DOCUMENTS

2012/0230088 A1 9/2012 Houston
2012/0243302 A1 9/2012 Nii et al.
2012/0299106 A1 11/2012 Mann

* cited by examiner

SRAM CELL COMPRISING FINFETS

CROSS-REFERENCE TO RELATED APPLICATION

This application relates the following commonly-assigned U.S. patent application Ser. No. 13/691,187, filed Nov. 30, 2012, and entitled "SRAM Cell Comprising FinFETs;", which application is hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements.

Figure 1:
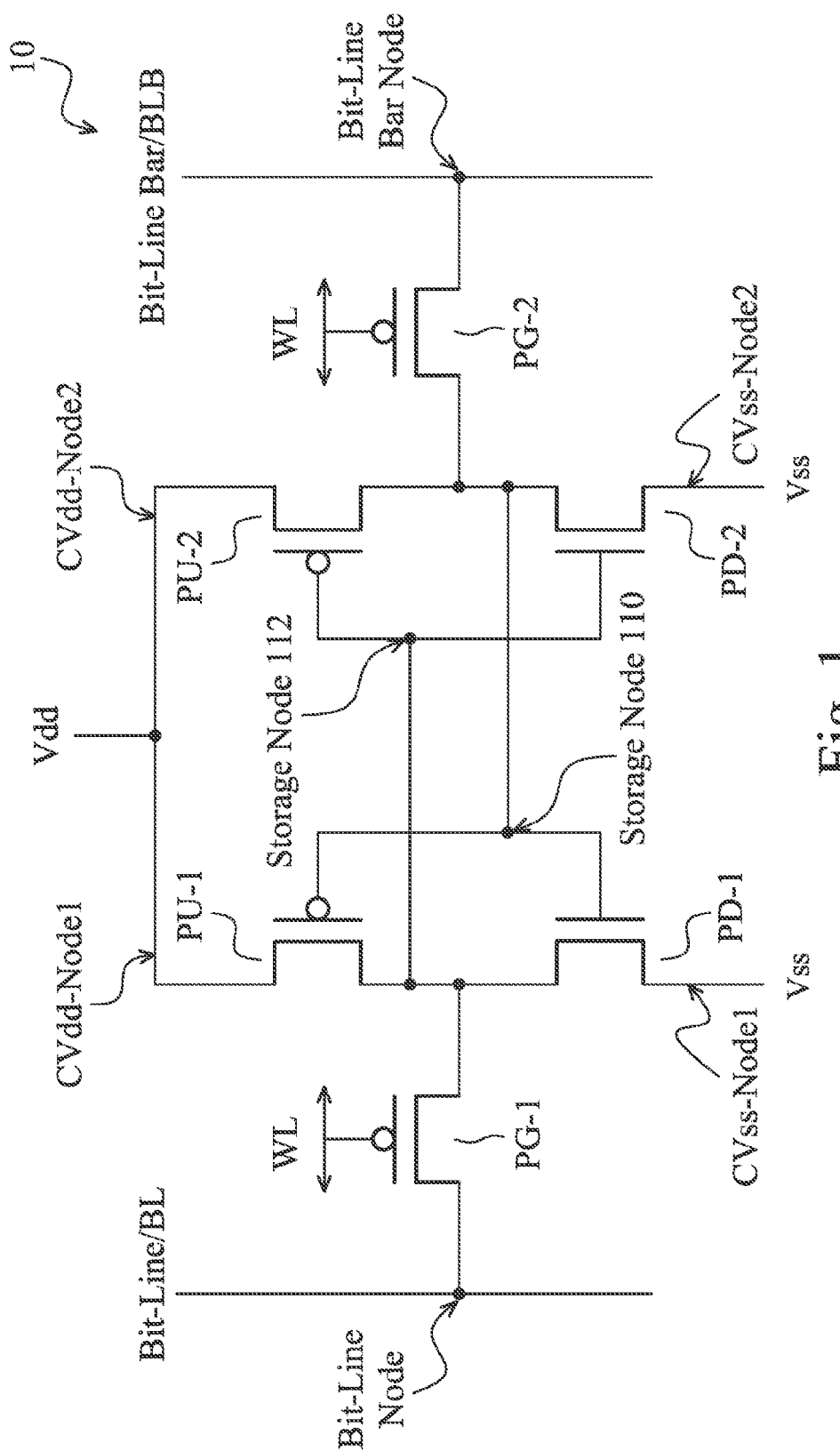
FIGS. 1 and 2 are circuit diagrams of a Static Random Access Memory (SRAM) cell in accordance with exemplary embodiments.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. Pass-gate transistors PG-1 and PG-2 are P-type transistors in accordance with some embodiments. The gates of pass-gate transistors PG-1 and PG-2 are connected to, and controlled by, word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in storage node 110 and storage node 112. The stored bit can be written into, or read from, SRAM cell 10 through Bit-line line (BL) and Bit-Line Bar (BLB), wherein BL and BLB may carry complementary bit-line signals. SRAM cell 10 is powered through a positive power supply node Vdd that has a positive power supply voltage (also denoted as Vdd). SRAM cell 10 is also connected to power supply voltage Vss, which may be an electrical ground.

The sources of pull-up transistors PU-1 and PU-2 are connected to CVdd-node1 and CVdd-node2, respectively, which are further connected to power supply voltage Vdd. Power supply voltage Vdd may be carried by metal lines CVdd-line, CVdd-line-1, and CVdd-line-2, as shown in FIGS. 11 through 21. The sources of pull-down transistors PD-1 and PD-2 are connected to CVss-node1 and CVss-node2, respectively, which are further connected to power supply voltage Vss. Voltage Vss may be carried by metal lines CVss-line, CVss-line-1, and CVss-line-2, as also shown in FIGS. 11 through 21. The gates of transistors PU-1 and PD-1 are connected to the drains of transistors PU-2 and PD-2, which connection node is storage node 110. The gates of transistors PU-2 and PD-2 are connected to the drains of transistors PU-1 and PD-1, which connection node is storage node 112. A source/drain region of pass-gate transistor PG-1 is connected to Bit-line BL at a Bit-line node. A source/drain region of pass-gate transistor PG-2 is connected to Bit-line bar BLB at a Bit-line bar node.

Figure 2:
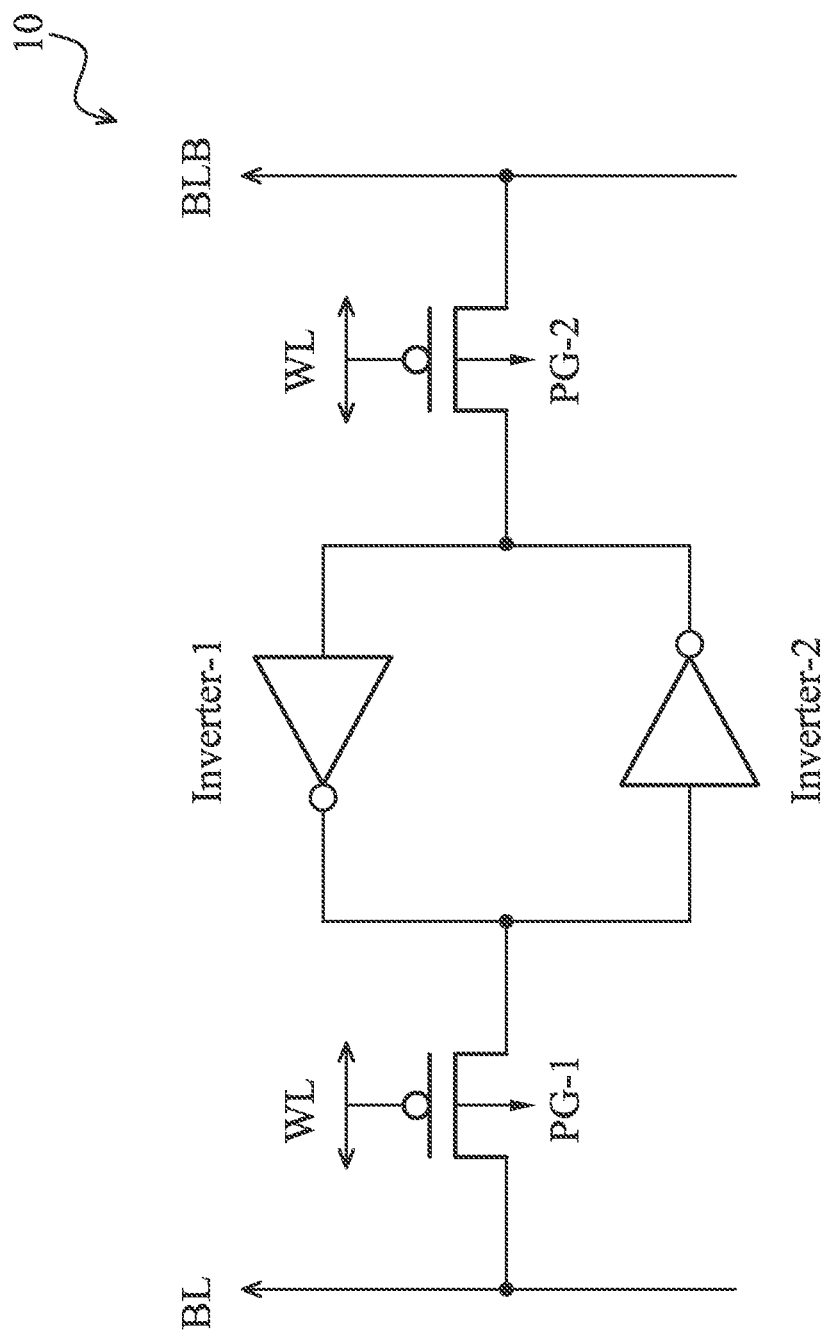

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
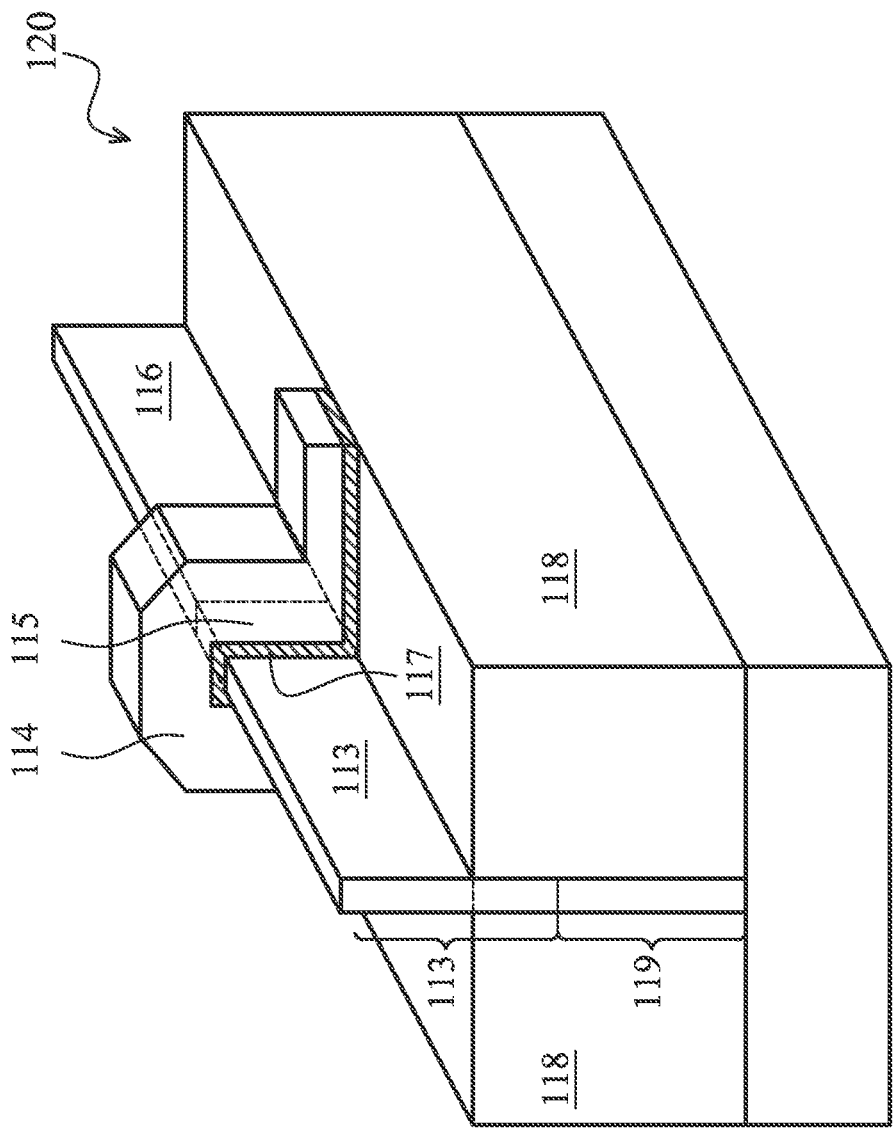
FIG. 3 is a perspective view of a Fin Field-Effect Transistor (FinFET)

FIG. 3 illustrates a perspective view of FinFET transistor 120, which may be any of the FinFETs in SRAM cell 10, including PG-1, PU-1, PD-1, PG-2, PU-2, and PD-2. FinFET 120 includes gate dielectric 117, gate electrode 114, and a semiconductor fin, which includes center fin portion 115, drain region 113, and source region 116. Insulation regions 118 are formed on opposite sides of semiconductor strip 119, over which fin portion 115 is located. Fin portion 115 may be aligned to, and may comprise a same material as, semiconductor strip 119 in some exemplary embodiments. Fin portion 115, drain region 113, and source region 116 in combination represents semiconductor fins 14, 20, 34, and/or 40 (for example, FIGS. 5 through 8) throughout the layouts of the present disclosure. Isolation regions 118 may be Shallow Trench Isolation (STI) regions, although field oxide regions may be used. Gate dielectric 117 and gate electrode 114 comprise portions on the sidewalls and a top surface of fin portion 115. Accordingly, the channel between drain region 113 and source region 116 includes sidewall portions and the top surface portion of semiconductor fin 115.

In some embodiments, drain region 113 and source regions 116 of p-type FinFETs PG-1, PG-2, PU-1, and PU-2 are formed by implanting end portions of the semiconductor fin with a p-type impurity such as boron, indium, or the like. In alternative embodiments, drain region 113 and source regions 116 are formed by etching end portions of original fin (such as fins 14 and 34 in FIGS. 5 through 8) to form recesses, and growing epitaxy regions in the recesses. The epitaxy regions may include Si, SiGe, SiGe C, Ge, or combinations thereof. Accordingly, in FIG. 3, drain region 113 and source regions 116 may comprise silicon germanium in some exemplary embodiments, while the underlying semiconductor strip may be silicon strips. P-type impurities may be in-situ doped in the source and drain regions during the epitaxy. By forming the epitaxy regions, the drive currents Ion of pass-gate FinFETs PU-1 and PU-2 may be stronger than the drive currents Ion of pull-down transistor PD-1 and PD-2 by at least 5% or greater.

Figure 4:
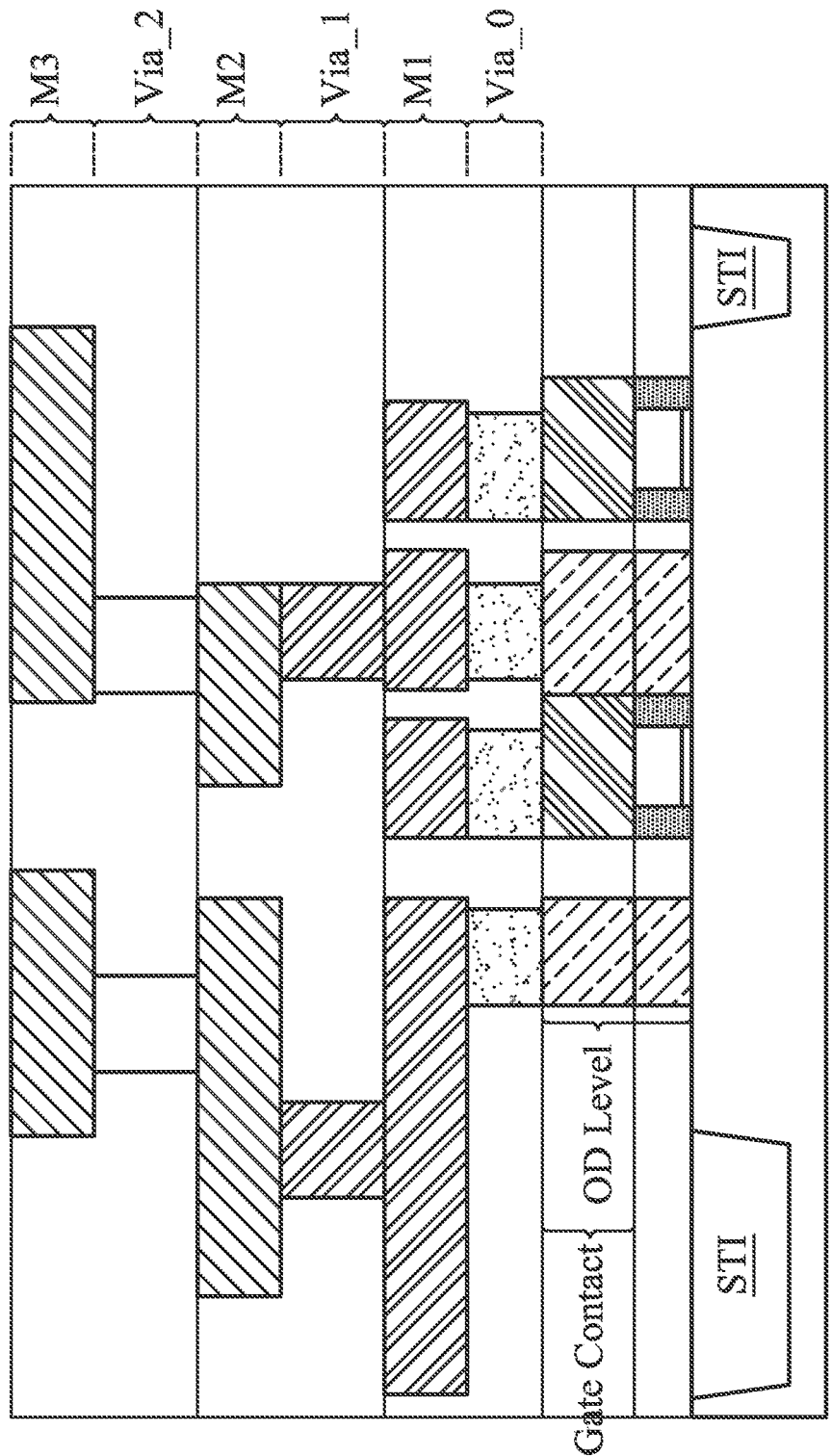
FIG. 4 illustrates a schematic cross-sectional view illustrating layers of an SRAM cell.

FIG. 4 illustrates a schematic cross-sectional view of SRAM cell 10, which layers are formed on a semiconductor chip or wafer. It is noted that FIG. 4 is schematically illustrated to show various levels of interconnect structure and transistors, and may not reflect the actual cross-sectional view of SRAM cell 10. The interconnect structure includes gate contact level, an OD (wherein the term "OD" represents "active region") level, via levels Via_0, Via_1, and Via_2, and metal layers M1, M2, and M3. Each of the levels and layers includes one or more dielectric layers and the conductive features formed therein. The conductive features that are at the same level may have top surfaces substantially level to each other, bottom surfaces substantially level to each other, and may be formed simultaneously. The features in the gate contact level connects gate electrodes of transistors (such as the illustrated exemplary transistors PU-1 and PU-2) to an overlying level such as the Via_0 level. The features in the OD level connects source and drain regions of transistors, pickup regions of well regions, and the like to an overlying level such as the Via_0 level.

Figure 5:
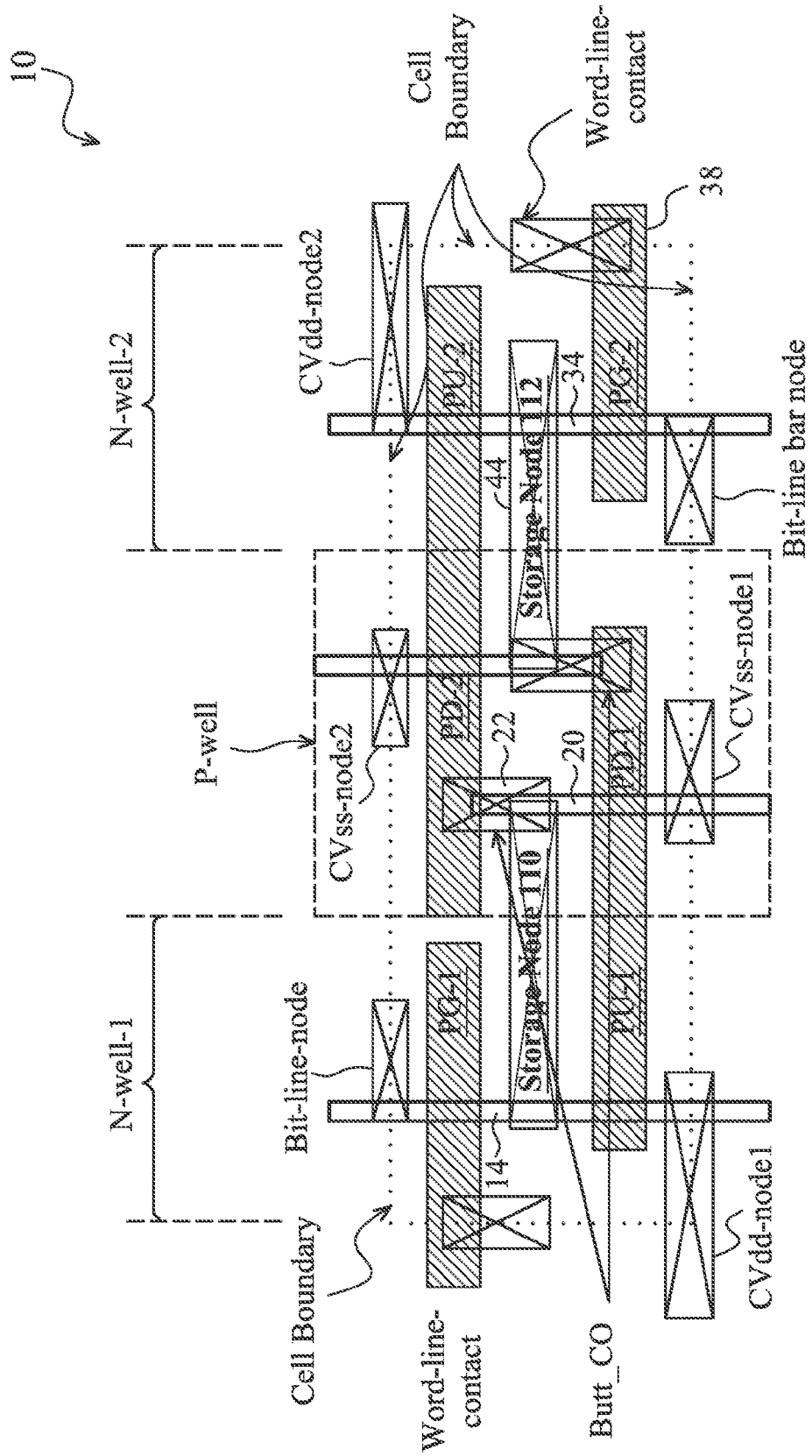
FIGS. 5-8 are layouts of some exemplary SRAM cells in accordance with various embodiments.

FIG. 5 illustrates a layout of SRAM cell 10 in accordance with exemplary embodiments. The outer boundaries of SRAM cell 10 are illustrated using dashed lines, which form a rectangle. Nodes CVdd-node1, CVdd-node2, CVss-node1, CVss-node2, bit-line-node, and bit-line bar node, which are shown in FIG. 1, are also illustrated in FIG. 5. Also, some other nodes such as Word-line contacts are also illustrated in FIG. 5. Gate electrode 16 forms pull-up transistor PU-1 with the underlying semiconductor fin 14. Gate electrode 16 further forms pull-down transistor PD-1 with the underlying semiconductor fin 20. Gate electrode 18 forms pass-gate transistor PG-1 with the underlying semiconductor fin 14, which is the same fin that also forms pull-up transistor PU-1. Gate electrode 36 forms pull-up transistor PU-2 with the underlying semiconductor fin 34. Gate electrode 36 further forms pull-down transistor PD-2 with the underlying semiconductor fin 40. Gate electrode 38 forms pass-gate transistor PG-2 with the underlying semiconductor fin 34, which is the same fin that also form pull-up transistor PU-2.

SRAM cell 10 includes a P-well region and two N-well regions N-well-1 and N-well-2 on opposite sides of the P-well region. A first butted contact plug Butt-CO is used to electrically connect gate electrode 36 of transistors PU-2 and PD-2 to the drain region of transistor PD-1, and a second butted contact plug Butt-CO is used to electrically connect gate electrode 16 of transistors PU-1 and PD-1 to the drain region of transistor PD-2. Butted contacts Butt-CO are formed in the contact level and the OD level in FIG. 4. Long contact 24 is used to connect fin 14 (the drain region of FinFET PU-1) to fin 20 and the first butted contact Butt-CO, wherein long contact 24 and the first butted contact Butt-CO form storage node 110 (also refer to FIG. 1). Long contact 24 has a longitudinal direction perpendicular to the longitudinal directions of fins 14, 20, 34, and 40. Long contact 44 is used to connect fin 34 (the drain region of FinFET PU-2) to fin 40 and the second butted contact Butt-CO, wherein long contact 44 and the second butted contact Butt-CO form storage node 112 (also refer to FIG. 1). Long contact 44 has a longitudinal direction parallel to the longitudinal direction of long contact 24.

Figure 6:
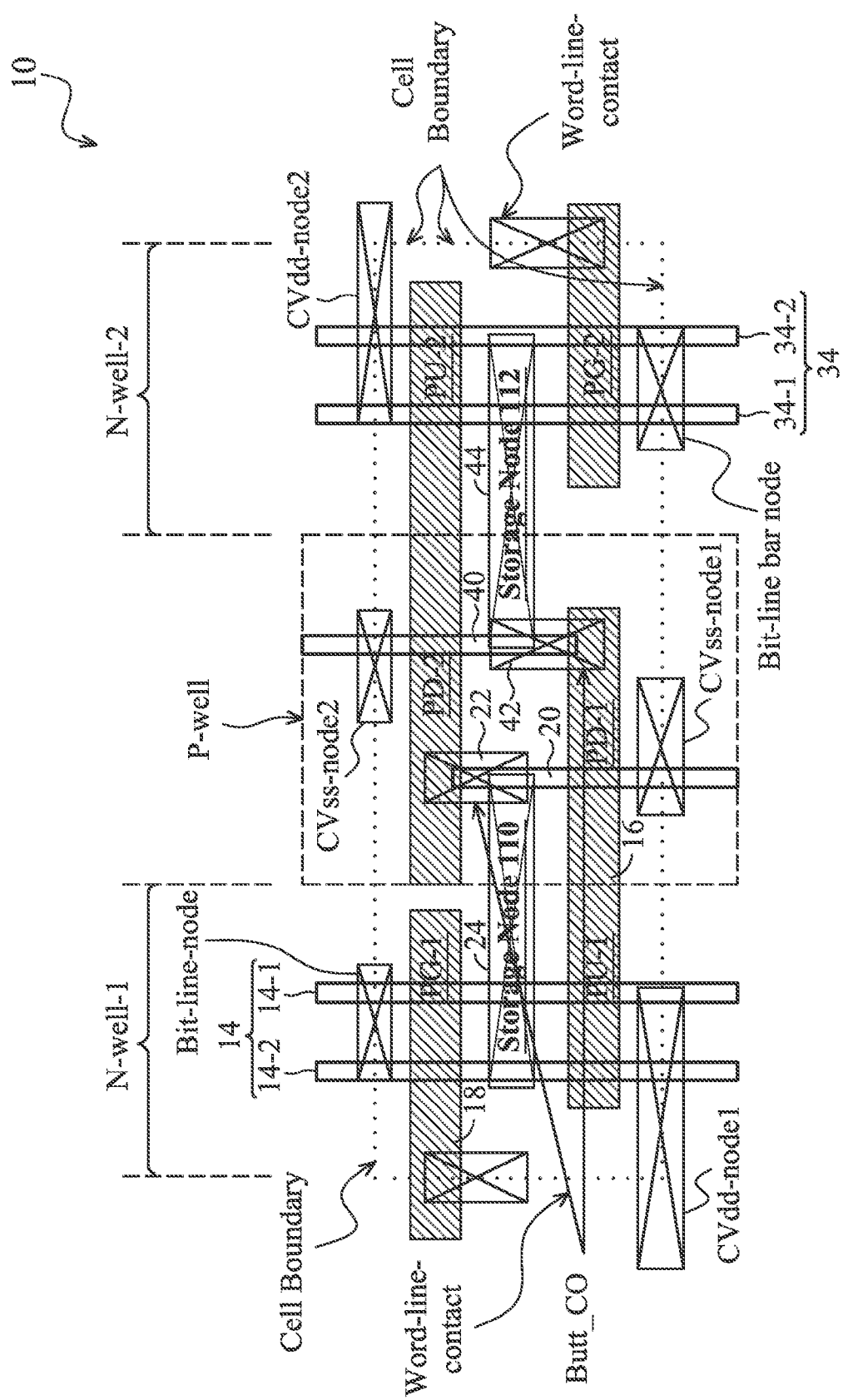
Figure 7:
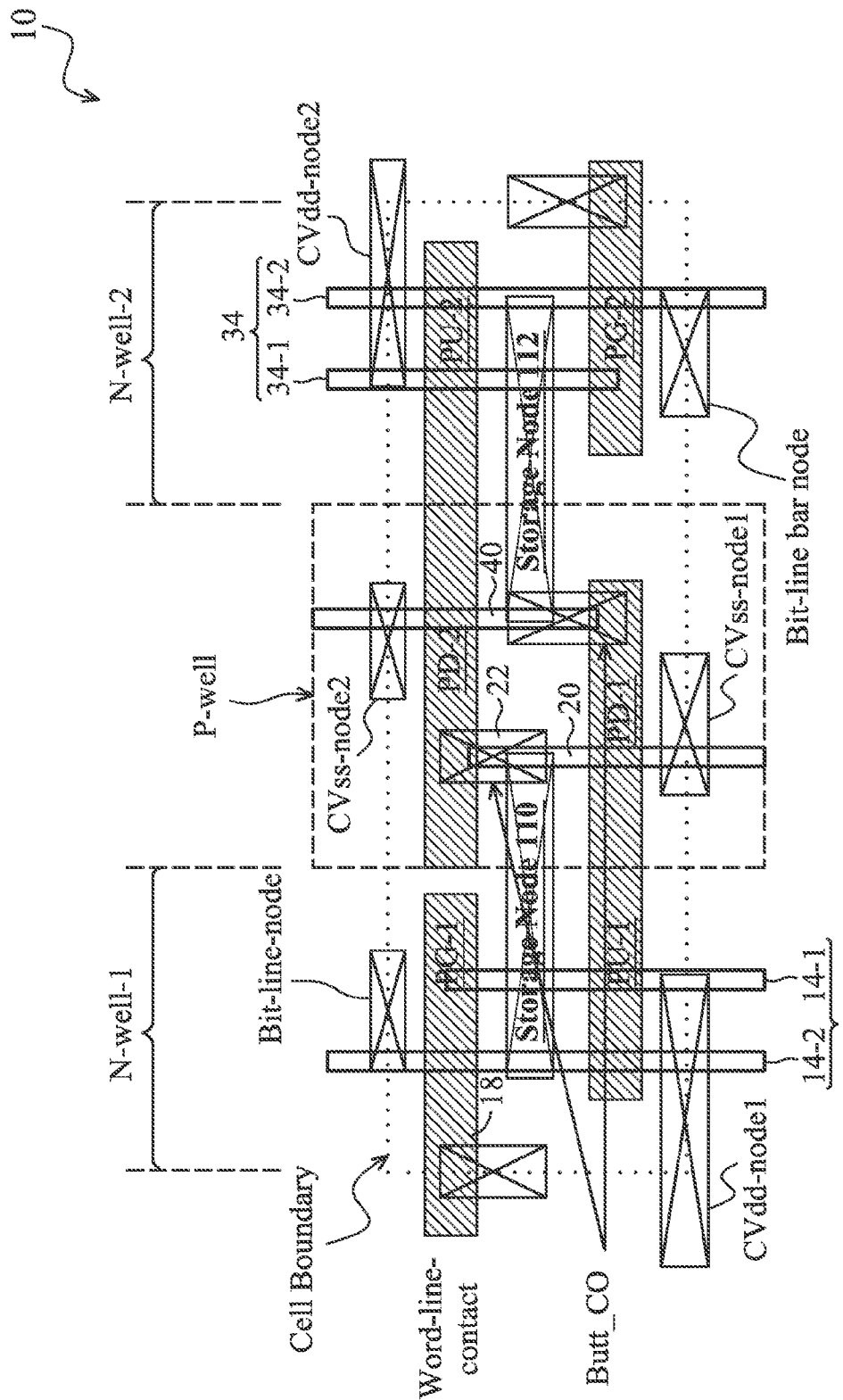
Figure 8:
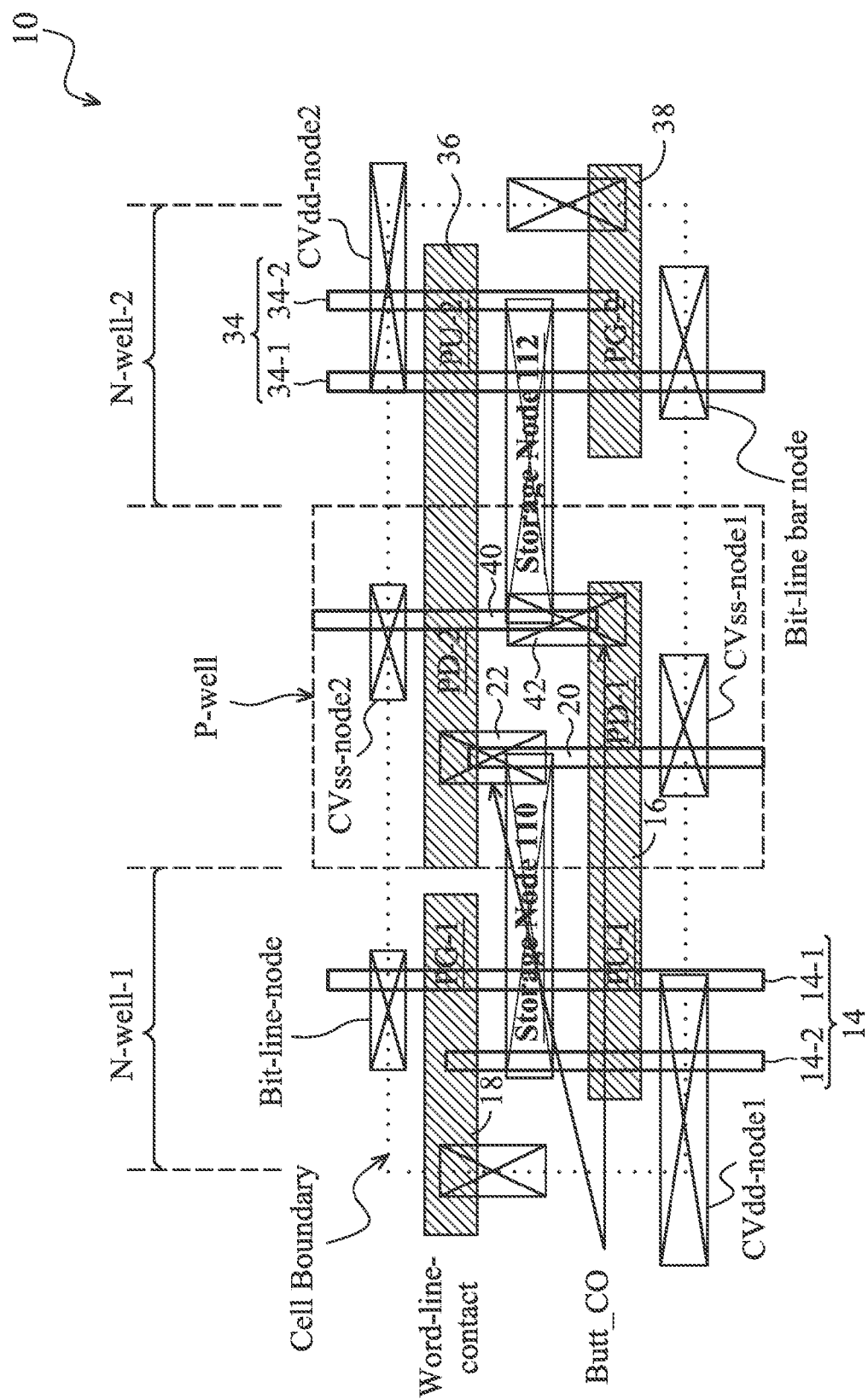

FIGS. 6 through 8 illustrate the layouts of SRAM cell 10 in accordance with alternative embodiments. Unless specified otherwise, the components in subsequently discussed embodiments are essentially the same as the like components, which are denoted by like reference numerals in the embodiments shown in FIGS. 1 through 5. The details regarding the components shown in the subsequently discussed embodiments may thus be found in the discussion of the embodiment shown in FIGS. 1 through 5.

FIG. 6 illustrates SRAM cell 10, which is similar to the embodiments in FIG. 5, except that each of p-type FinFETs PG-1, PU-1, PG-2, and PU-2 may be a multi-fin FinFET comprising a plurality of (such as two, three, four, or more) semiconductor fins. Pull-down FinFETs PD-1 and PD-2 may be single-fin FinFETs, with each including a single semiconductor fin (20 or 40), although they can also be multi-fin FinFETs. For example, as shown in FIG. 6, each of p-type FinFETs PG-1 and PU-1 comprises two fins 14, which are denoted as 14-1 and 14-2, and each of p-type FinFETs PG-2 and PU-2 comprises two fins 34, which are denoted as 34-1 and 34-2. By adding more fins, the currents Ion of p-type FinFETs PG-1, PU-1, PG-2, and PU-2 are improved, and hence the speed of SRAM cell 10 is improved. Again, FIG. 6 includes SRAM cell 10 that includes a P-well region formed between two N-well regions N-well-1 and N-well-2.

FIG. 7 illustrates SRAM cell 10, wherein each of pull-up FinFETs PU-1 and PU-2 includes two fins 14-1 and 14-2. Pass-gate FinFETs PG-1 and PG-2, however, are single-fin FinFETs. Pull-down FinFETs PD-1 and PD-2 may be single-fin FinFETs, although they can also be multi-fin FinFETs. FIG. 8 illustrates an embodiment similar to the embodiment in FIG. 7, except that in FIG. 7, fin 34-1, which is closer to the P-well region, does not extend underlying gate electrode 38, and fin 34-2, which is closer to the P-well, extends underlying gate electrode 38. In FIG. 8, however, fin 34-1 extends underlying gate electrode 38, and fin 34-2 does not extend underlying gate electrode 38. Similarly, fins 14-1 and 14-2 in FIGS. 7 and 8 have similar arrangement as fins 34-1 and 34-2, respectively.

Figure 9:
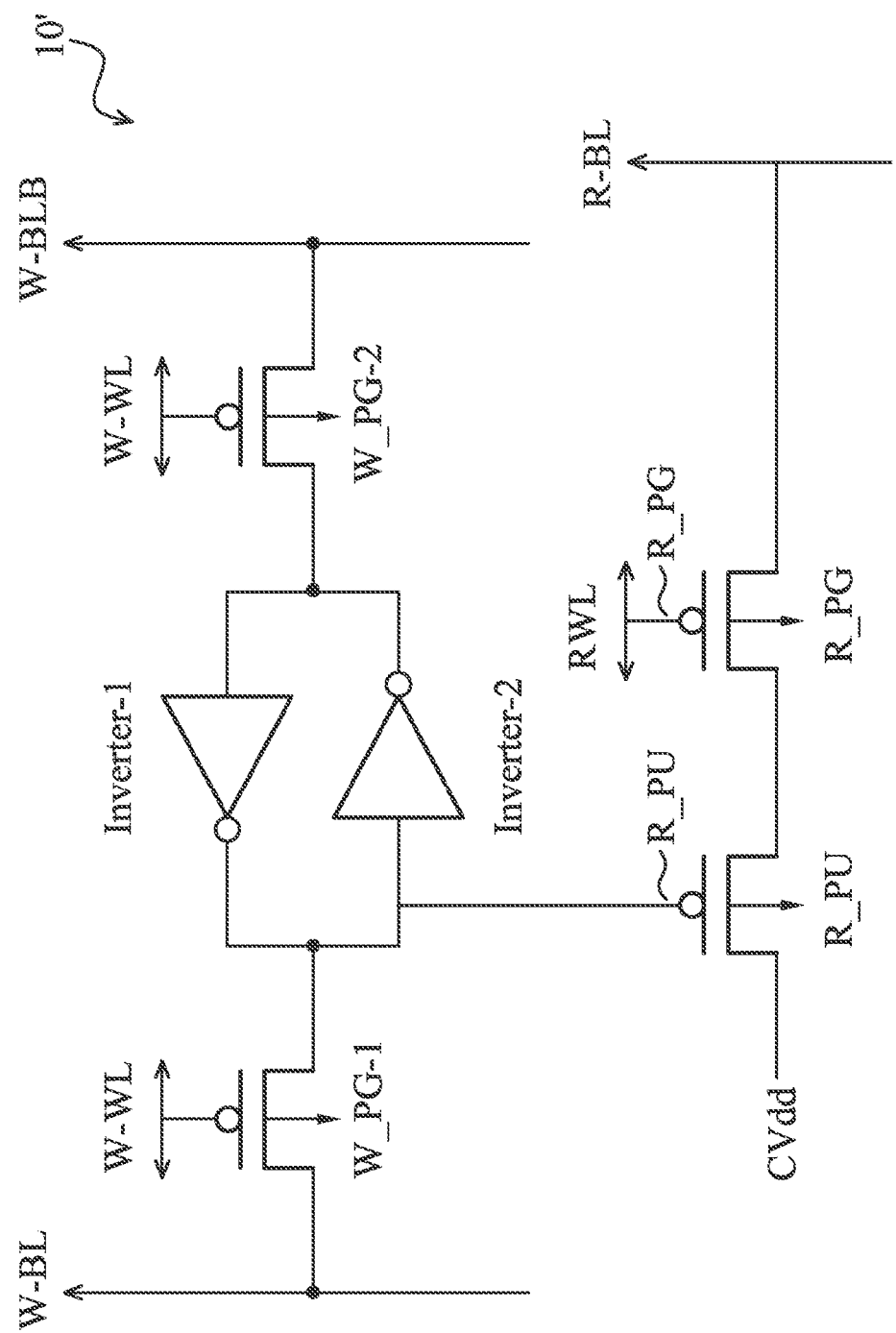
FIG. 9 is a circuit diagram of a two-port SRAM cell in accordance with exemplary embodiments.

FIG. 9 illustrates a circuit diagram of a two-port SRAM cell 10', which includes a write port and a read port. The write port includes inverters Inverter-1 and Inverter-2, which are essentially the same as the inverters Inverter-1 and Inverter-2 in FIG. 2, wherein inverter Inverter-1 includes FinFETs PU-1 and PD-1 in FIG. 1, and inverter Inverter-2 includes FinFETs PU-2 and PD-2 in FIG. 1. The write port further includes p-type pass-gate FinFETs W_PG-1 and W_PG-2, wherein the gates of FinFETs W_PG-1 and W_PG-2 are coupled to write word-line W-WL. The writing of SRAM cell 10' is through complementary write bit-lines W-BL and W-BLB. The read port includes inverters Inverter-1 and Inverter-2, pull-up transistor R_PU, and pass-gate transistor R_PG. Transistors R_PU and R_PG are p-type transistors, and may be FinFETs, which have the structure similar to what is shown in FIG. 3. The data read from SRAM cell is sent to read bit-line R-BL. Transistors R_PU is further coupled to positive power supply CVdd and either one of the inputs of inverters Inverter-1 and Inverter-2. Transistors R_PU and R_PG are cascaded. The gate of transistor R-PG may be coupled to read word-line WL.

Figure 10:
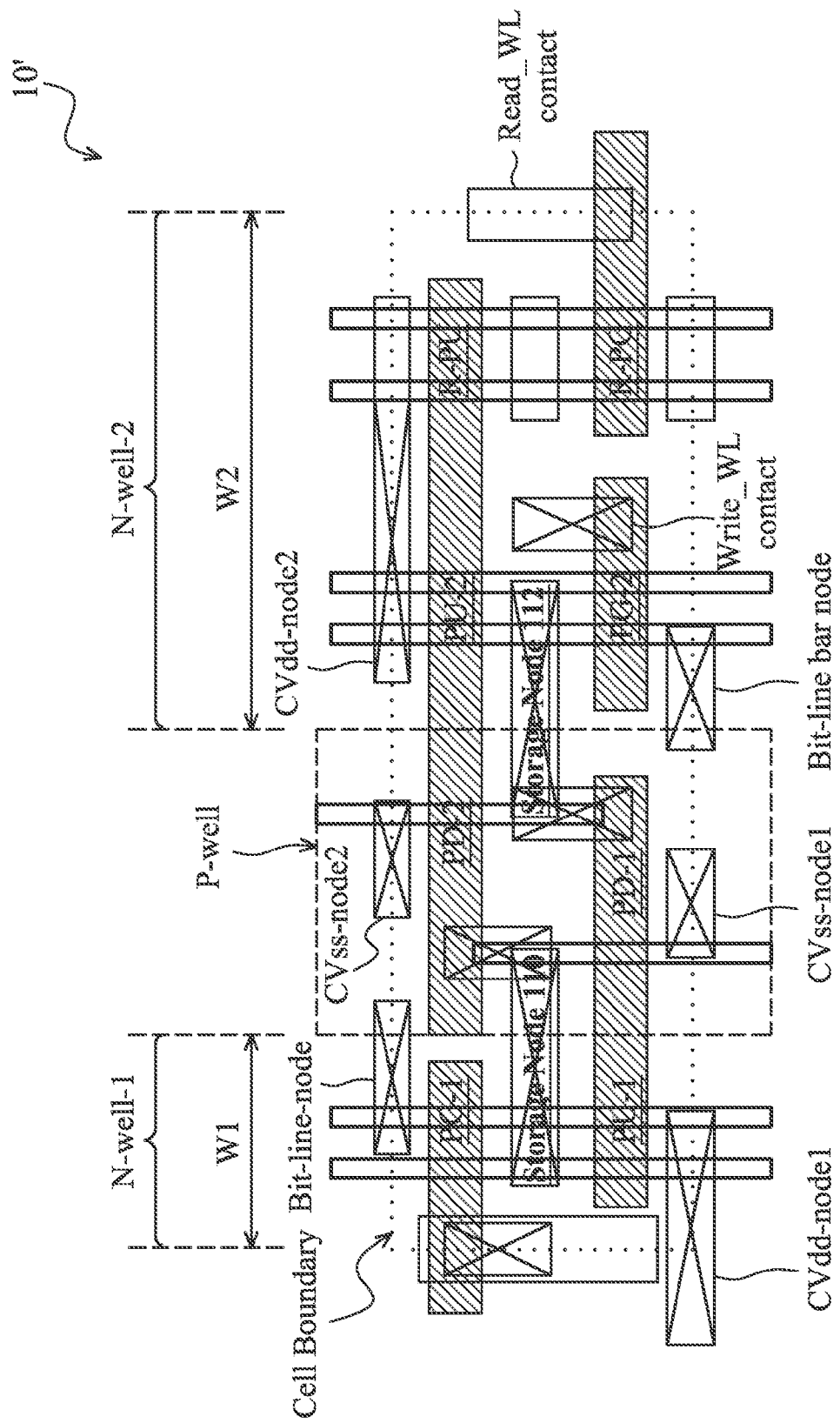
FIG. 10 illustrates a layout of the two-port SRAM cell in FIG. 9 in accordance with exemplary embodiments.

FIG. 10 illustrates an exemplary layout of the two-port SRAM cell 10', which includes a P-well region located between two N-well regions N-well-1 and N-well-2. P-type FinFETs R_PU and R_PG are disposed in N-well region N-well-2. Accordingly, width W2 of N-well region N-well-2 is greater than width W1 of N-well region N-well-1 in order to accommodate FinFETs R_PU and R_PG. It is realized that although transistors PG-1, PU-1, PG-2, PU-2, R_PU, and R_PG are illustrated as two-fin FinFETs, each of them may be a single-fin FinFET or may include more than two fins.

Figure 11:
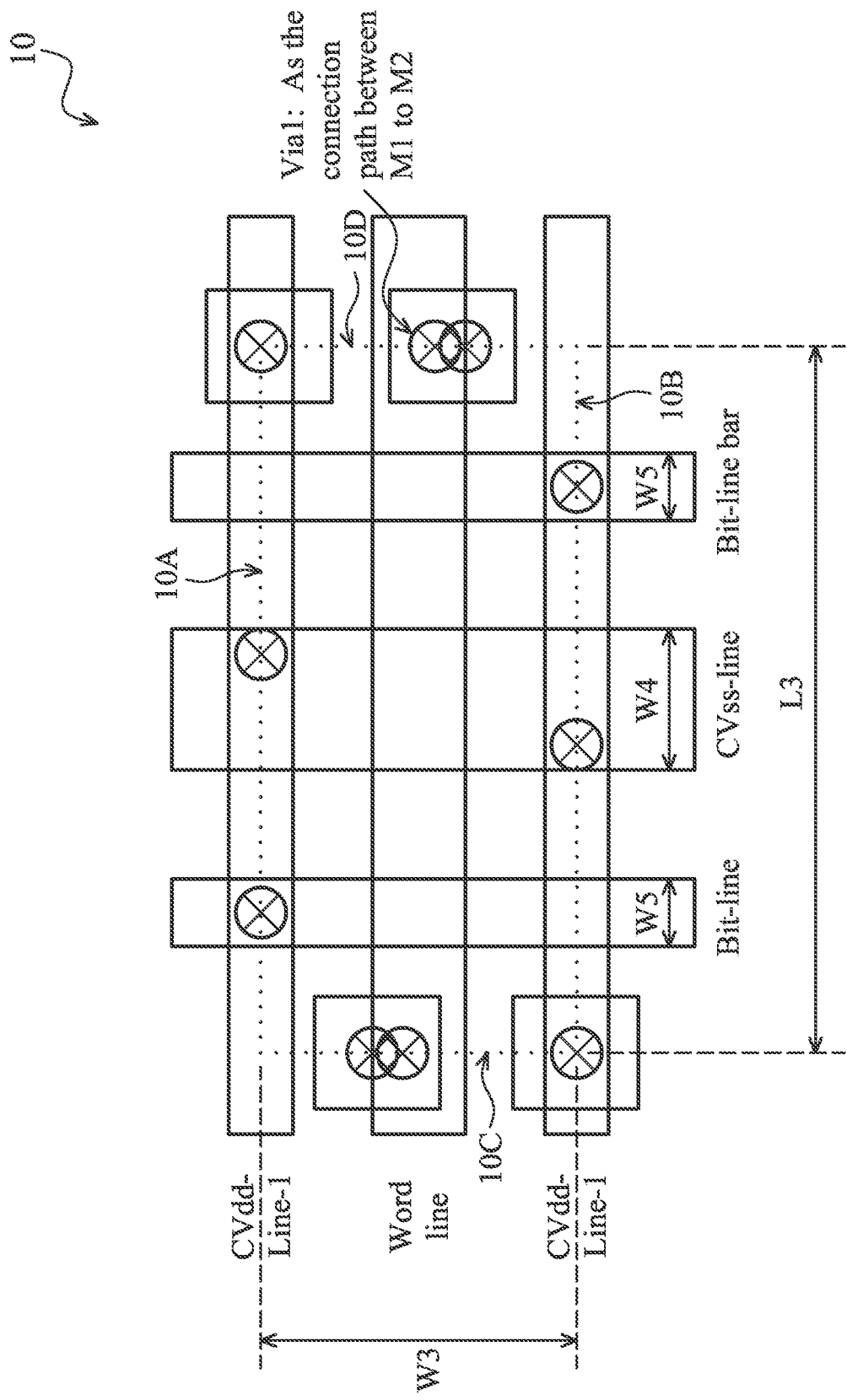
FIGS. 11-14 are layouts of power supply lines and signal lines of an SRAM cell in accordance with various embodiments.

FIGS. 11 through 21 illustrate circuit diagrams or layouts in accordance with alternative embodiments, which illustrate how power supply lines and signal lines of SRAM cells are laid out. Referring to FIG. 11, SRAM cell 10 includes boundaries 10A, 10B, 10C, and 10D, which cell boundaries form a rectangular shape. Cell boundaries 10A and 10B are opposite to each other, and are referred to as long cell boundaries. Cell boundaries 10C and 10D are opposite to each other, and are referred to as the short cell boundaries, which are shorter than long boundaries 10A and 10B.

In some embodiments, length L3 of SRAM cell 10 is greater than width W3 of SRAM cell 10, wherein length L3 is measured in the direction perpendicular to the lengthwise directions of the fins 14, 20, 34, and 40 (refer to FIG. 15), and parallel to the lengthwise directions of gate electrodes 16, 18, 36, and 38. Width W3 is measured in the direction perpendicular to the direction of length L3. Ratio L3/W3 may be greater than about 1.5, greater than about 2, greater than about 2.5, or greater than about 3. Accordingly, SRAM cell 10 is an elongated cell.

Metal line CVss-line, which carries voltage VSS for SRAM cell 10, is located in a same metal layer as metal lines Bit-line and Bit-line bar (also see FIG. 1). Metal lines Bit-line and Bit-line bar carry bit-line signals and bit-line bar signals, respectively. CVss-line may be located between metal lines Bit-line and Bit-line bar. In some embodiments, lines CVss-line, Bit-line, and Bit-line bar are in metal layer M1 (FIG. 4). Furthermore, width W4 of the CVss-line may be greater than width W5 of lines Bit-line and Bit-line bar, wherein ratio W4/W5 may be greater than about 1.5, or greater than about 2. Metal lines CVss-line, Bit-line, and Bit-line bar are perpendicular to, and cross over, the longer cell boundaries 10A and 10B. Accordingly, the length of the portion of CVss-line within SRAM cell may be equal to W3.

Metal lines Word-line and metal lines CVdd-line-1 and CVdd-line-2 are parallel to each other and are in the same metal layer. Metal lines CVdd-line-1 and CVdd-line-2 carry power supply voltage Vdd. The word-line is between lines CVdd-line-1 and CVdd-line-2, which may overlap the opposite long boundaries of SRAM cell 10. The CVdd-line and lines CVdd-line-1 and CVdd-line-2 are perpendicular to, and cross over, the shorter cell boundaries 10C and 10D. The length of the portion of CVdd-line within SRAM cell may be equal to L3. In some embodiments, the word-line and lines Vdd-line-1 and CVdd-line-2 may be in metal layer M2 (FIG. 1). The vias between metal layer M1 and M2, and the vias connecting metal lines in metal layer M1 to the underlying contact plugs are illustrated using the symbol with a circle and an "x" sign in the circle.

In accordance with some embodiments, laying out CVss-line in the width direction of SRAM cell 10 provides more space for allocating the CVss-line since length L3 is greater than width W3. Accordingly, width W4 of CVss-line may be increased. This provides a good grounding ability for SRAM cell 10 and the respective SRAM array.

Figure 12:
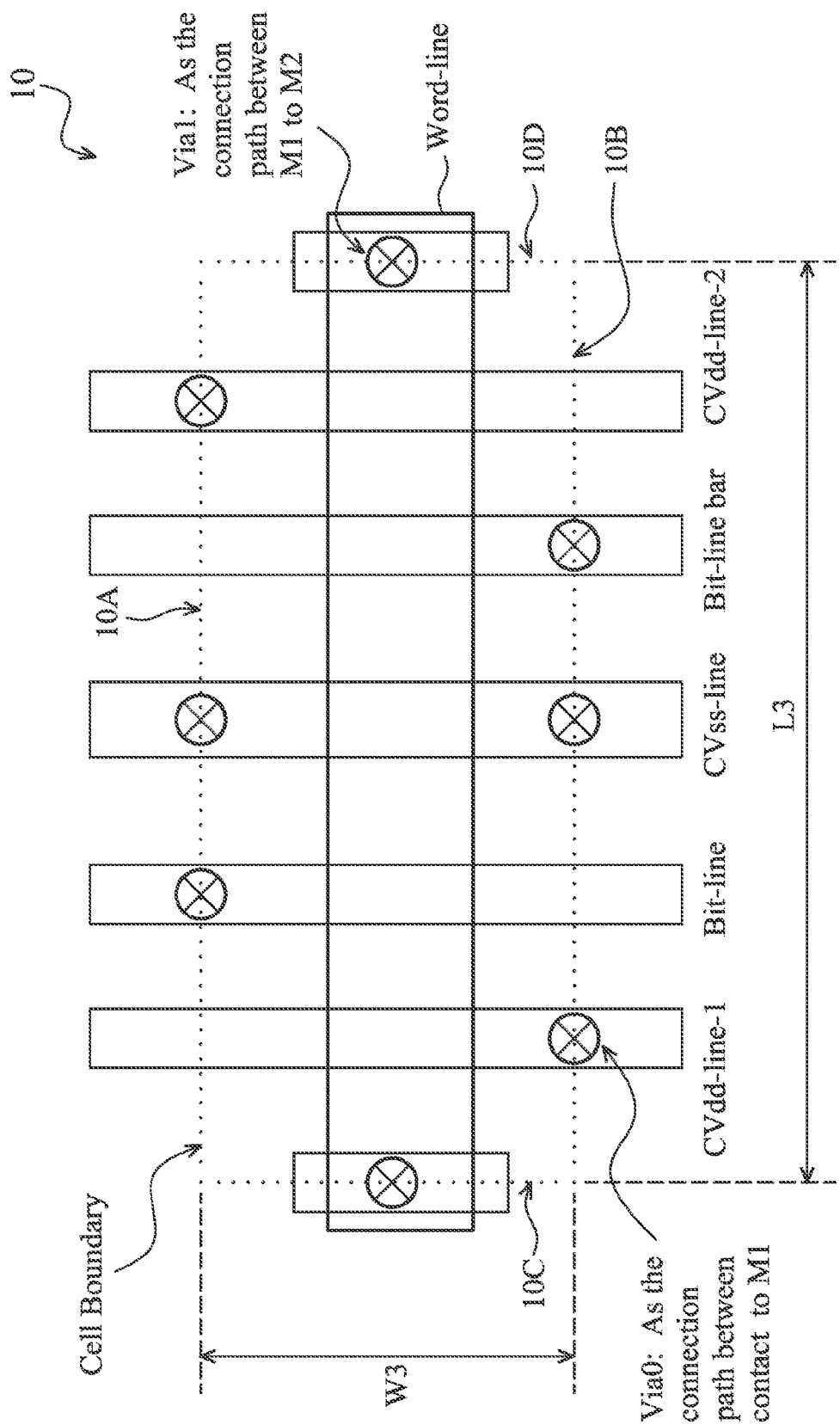

FIG. 12 illustrates a layout of the signal lines and the power supply lines of SRAM cell 10 in accordance with alternative embodiments. These embodiments are similar to the embodiments in FIG. 11, except that lines CVdd-line-1 and CVdd-line-2 are parallel to lines CVss-line, Bit-line, and Bit-line Bar. Furthermore, lines CVss-line, Bit-line, and Bit-line Bar may be allocated between lines CVdd-line-1 and CVdd-line-2. In these embodiments, lines CVss-line, Bit-line, Bit-line Bar, CVdd-line-1, and CVdd-line-2 are perpendicular to the long boundaries 10A and 10B, and hence there is a greater space for allocating these lines. Lines CVss-line, Bit-line, Bit-line Bar, CVdd-line-1, and CVdd-line-2 may be in metal layer M1 (FIG. 4) in accordance with some embodiments. The word-line may be perpendicular to the CVss-line, and may be in metal layer M2 (FIG. 4) in accordance with some embodiments.

Figure 13:
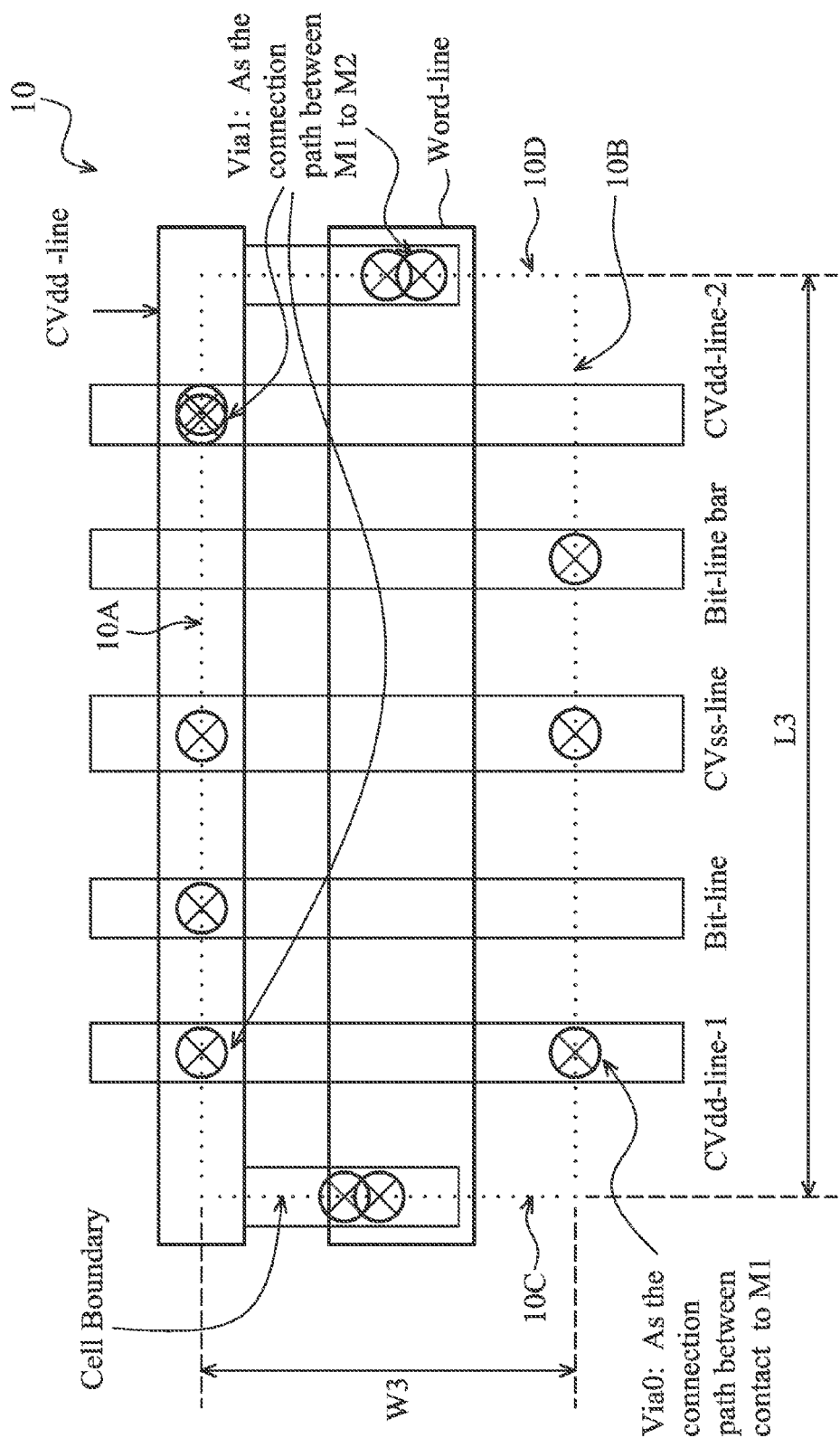

FIG. 13 illustrates a layout of the signal lines and power supply lines of SRAM cell 10 in accordance with alternative embodiments. These embodiments are similar to the embodiments in FIG. 12, except that there is an additional CVdd-line in metal layer M2 (FIG. 4). The additional CVdd-line may overlap (and may be parallel to) long boundary 10A. The CVdd-line in metal layer M2 may form a power mesh with metal lines CVdd-line-1 and CVdd-line-2, which may be in metal layer M1.

Figure 14:
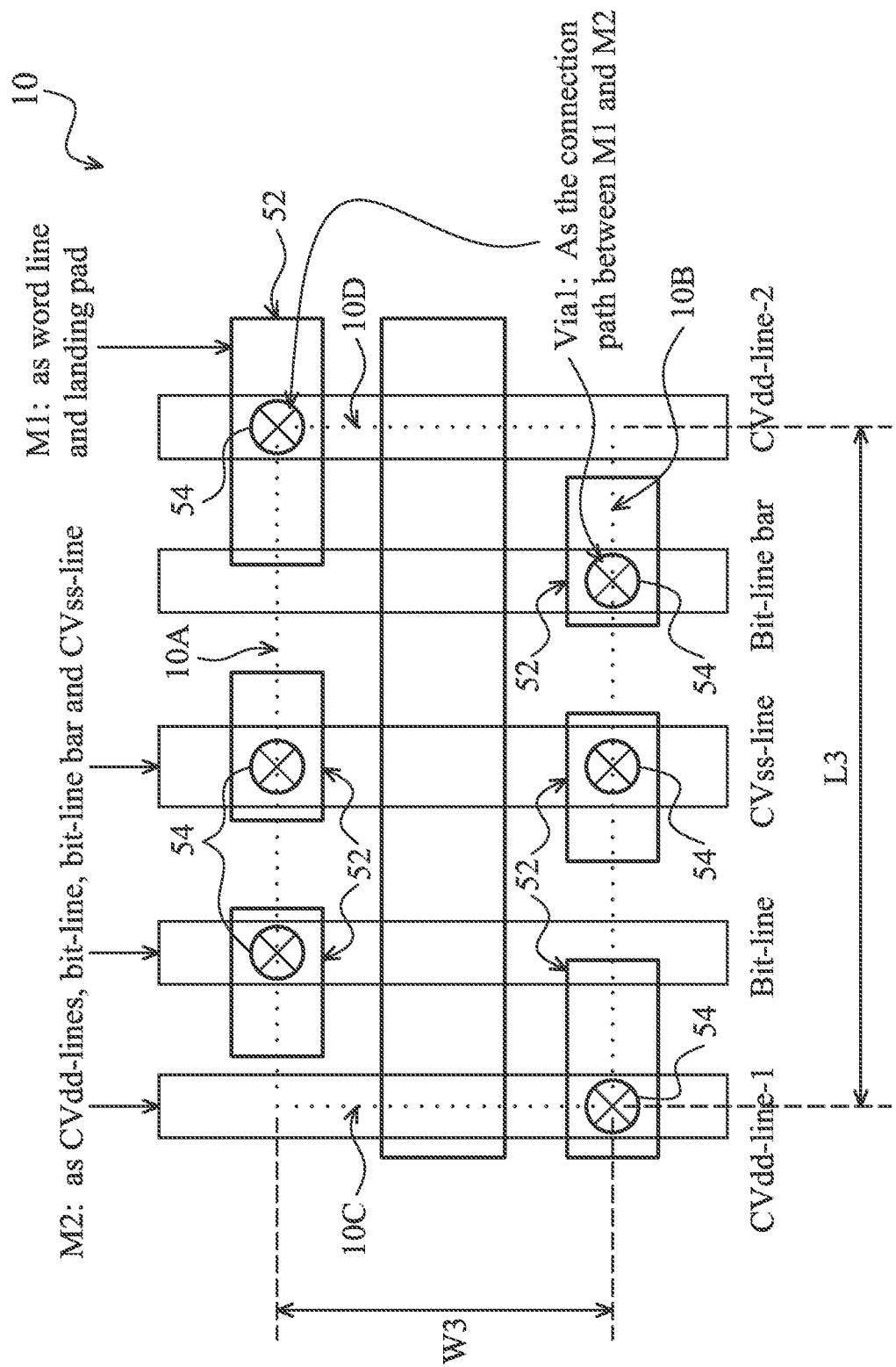

FIG. 14 illustrates a layout of the signal lines and the power supply lines of SRAM cell 10 in accordance with alternative embodiments. In these embodiments, lines CVss-line, Bit-line, Bit-line Bar, CVdd-line-1, and CVdd-line-2 may be in metal layer M2 (FIG. 4). Landing pads 52 are formed in metal layer M1, and are connected to the respective overlying lines CVss-line, Bit-line, Bit-line Bar, CVdd-line-1, and CVdd-line-2 through vias 54. Again, lines CVss-line, Bit-line, Bit-line Bar, CVdd-line-1, and CVdd-line-2 are perpendicular to the long boundaries 10A and 10B.

Figure 15:
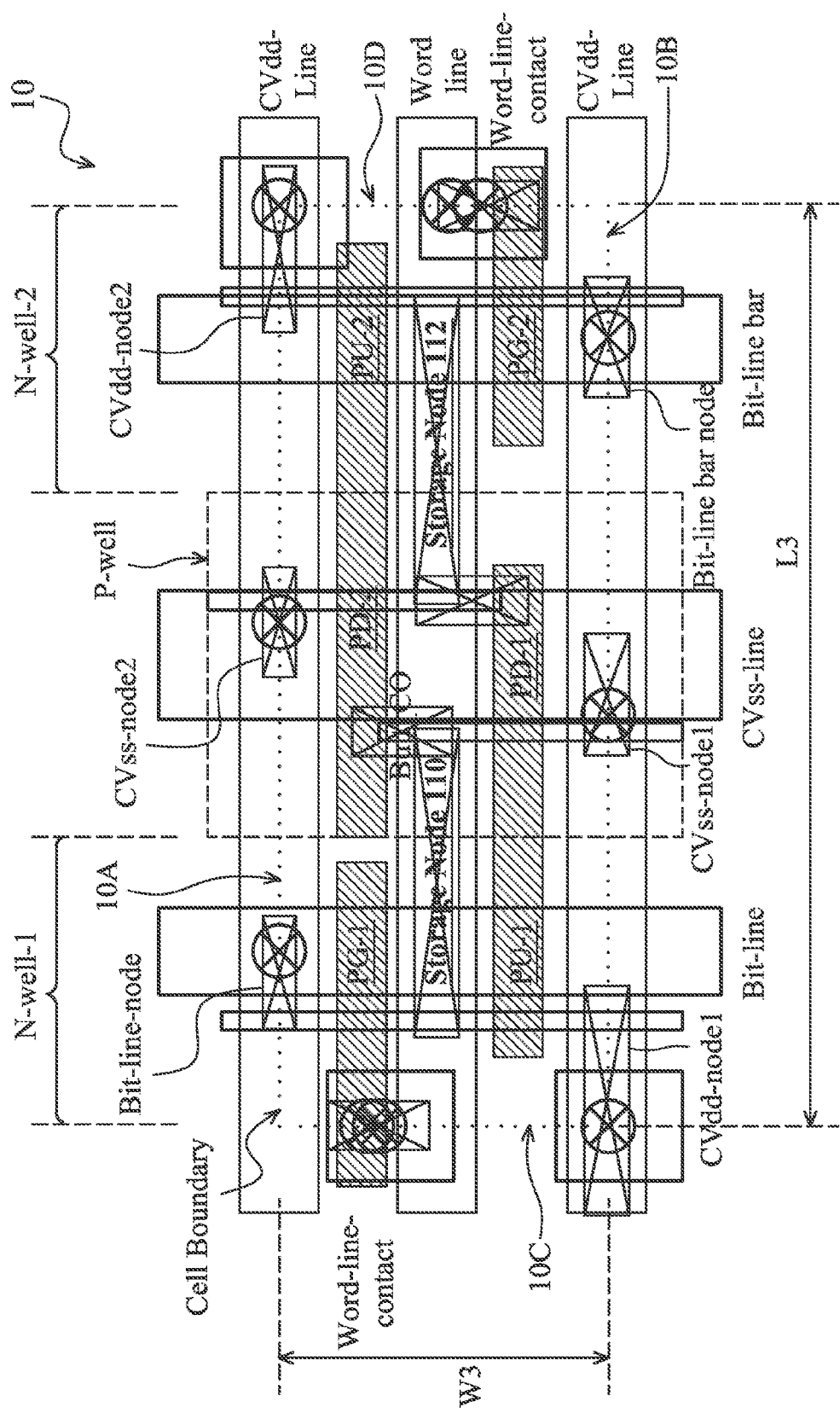
FIGS. 15-18 are layouts of SRAM cells in accordance with various embodiments, wherein the layouts of FinFET, the power supply lines, and the signal lines are combined.

FIG. 15 illustrates a combined layout including the layout of FinFETs in FIG. 5 and the layout of the signal lines and the power supply lines in FIG. 11. The combined layout illustrates the relationship between the FinFETs and the signal lines and power supply lines. The details regarding the layouts have been discussed referring to FIGS. 5 and 11, and hence are not repeated herein. Since the Bit-line and Bit-line Bar are connected to the source/drain regions of pass-gate FinFETs PG-1 and PG-2, respectively, the Bit-line and Bit-line Bar are allocated to overlap N-well regions N-well-1 and N-well-2, respectively. It is illustrated that, as shown in FIG. 1, the sources of pull-down FinFETs PD-1 and PD-2 are connected to power supply voltage Vss. Accordingly, by allocating CVss-line overlapping the P-well region, it is easy to provide power supply voltage Vss to the source regions of pull-down FinFETs PD-1 and PD-2.

Figure 16:
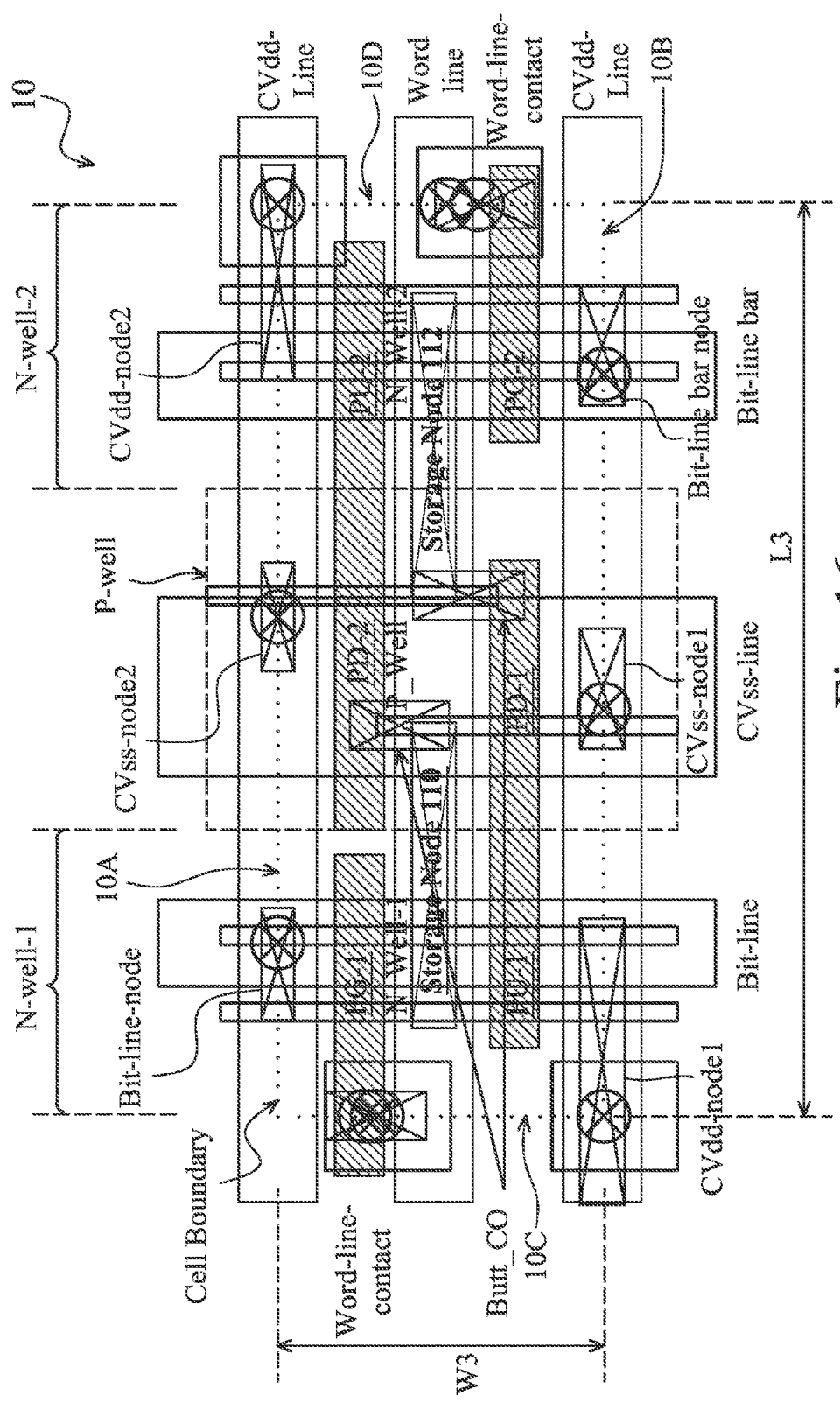
Figure 17:
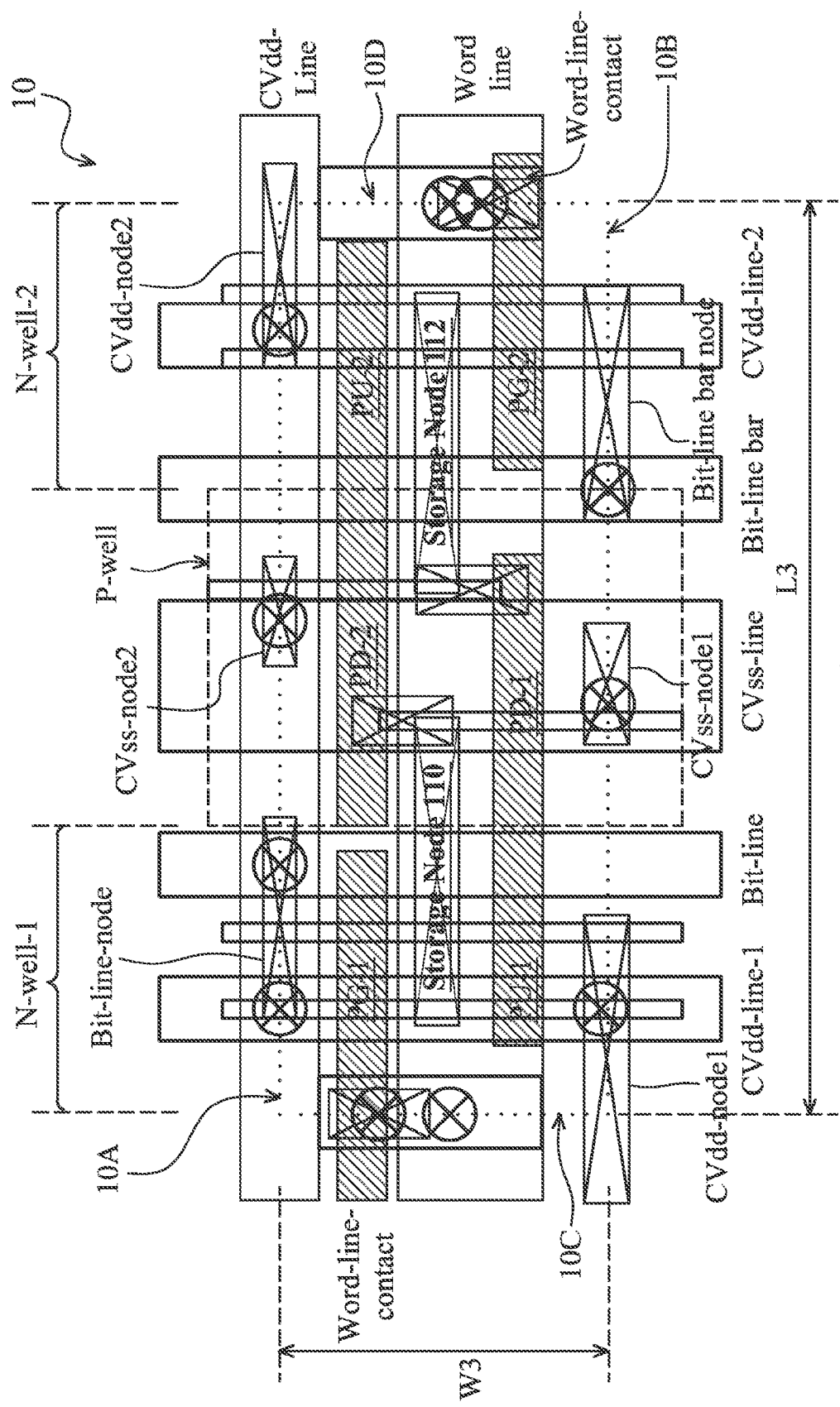

Similarly, FIG. 16 illustrates a combined layout including the layout of FinFETs in FIG. 6 and the layout of the signal lines and the power supply lines in FIG. 11. FIG. 17 illustrates a combined layout including the layout of FinFETs in FIG. 6 and the layout of the signal lines and the power supply lines in FIG. 13. It is appreciated that FIGS. 15 through 17 merely provide several examples as how the layouts in FIGS. 5 through 8 may be combined with the layout in FIGS. 11 through 14. In accordance with other embodiments, any of the layouts in FIGS. 5 through 8 may be combined with any of the layouts scheme in FIGS. 11 through 14.

Figure 18:
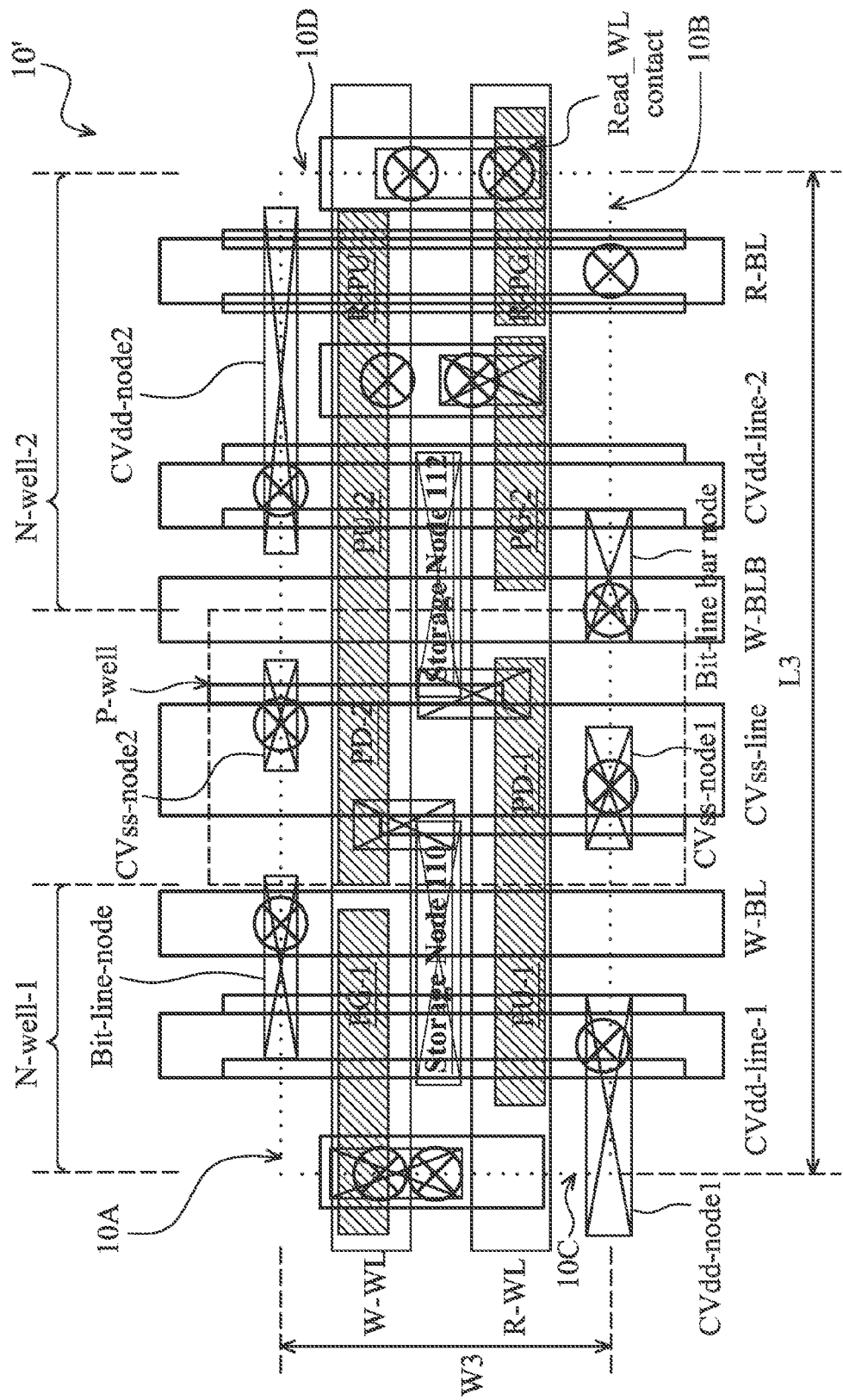

FIG. 18 illustrates a layout including the two-port SRAM cell 10' in FIG. 10 and the respective layout of the signal lines and power supply lines. In accordance with some embodiments, lines CVss-line, W-BL, W-BLB, CVdd-line-1, and CVdd-line-2 are in metal layer M1 (FIG. 4), and are perpendicular to the long boundaries 10A and 10B of SRAM cell 10'. The write word-line W-WL and the read word-line R-WL may be allocated in metal layer M2 (also see FIG. 4) and parallel to long boundaries 10A and 10B.

Figure 19:
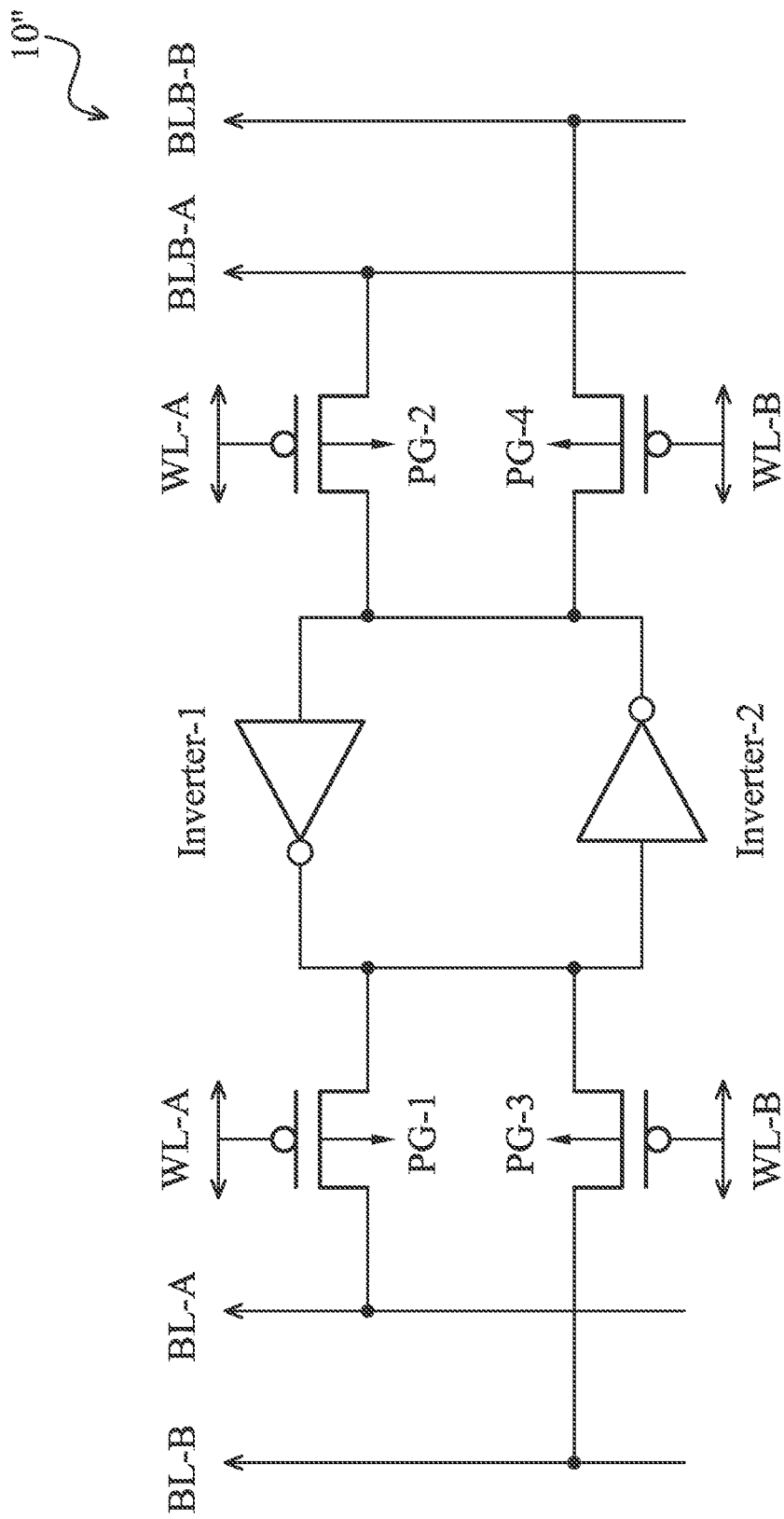
FIG. 19 is a circuit diagram of a dual-port SRAM cell in accordance with exemplary embodiments.

FIG. 19 illustrates a circuit diagram of a dual-port SRAM cell 10", which includes port A and port B, each may be configured as a read port or a write port. Port A includes inverters Inverter-1 and Inverter-2, which are essentially the same as the inverters Inverter-1 and Inverter-2 in FIG. 2. Port A further includes p-type pass-gate FinFETs PG-1 and PG-2, wherein the gates of FinFETs PG-1 and PG-2 are coupled to word-line WL-A. FinFETs PG-1 and PG-2 are further coupled to complementary bit-lines BL-A and BLB-A, respectively. Port B includes inverters Inverter-1 and Inverter-2, and p-type pass-gate FinFETs PG-3 and PG-4, wherein the gates of FinFETs PG-3 and PG-4 are coupled to word-line WL-B. FinFETs PG-3 and PG-4 are further coupled to complementary bit-lines BL-B and BLB-B, respectively. The layout of dual-port SRAM cell 10" may be found with reference to the layout in FIGS. 5-8, with all pull-down FinFETs in the p-well region, and all pull-up FinFETs and pass-gate FinFETs in the first and the n-well regions N-well-1 and N-well-2.

Figure 20:
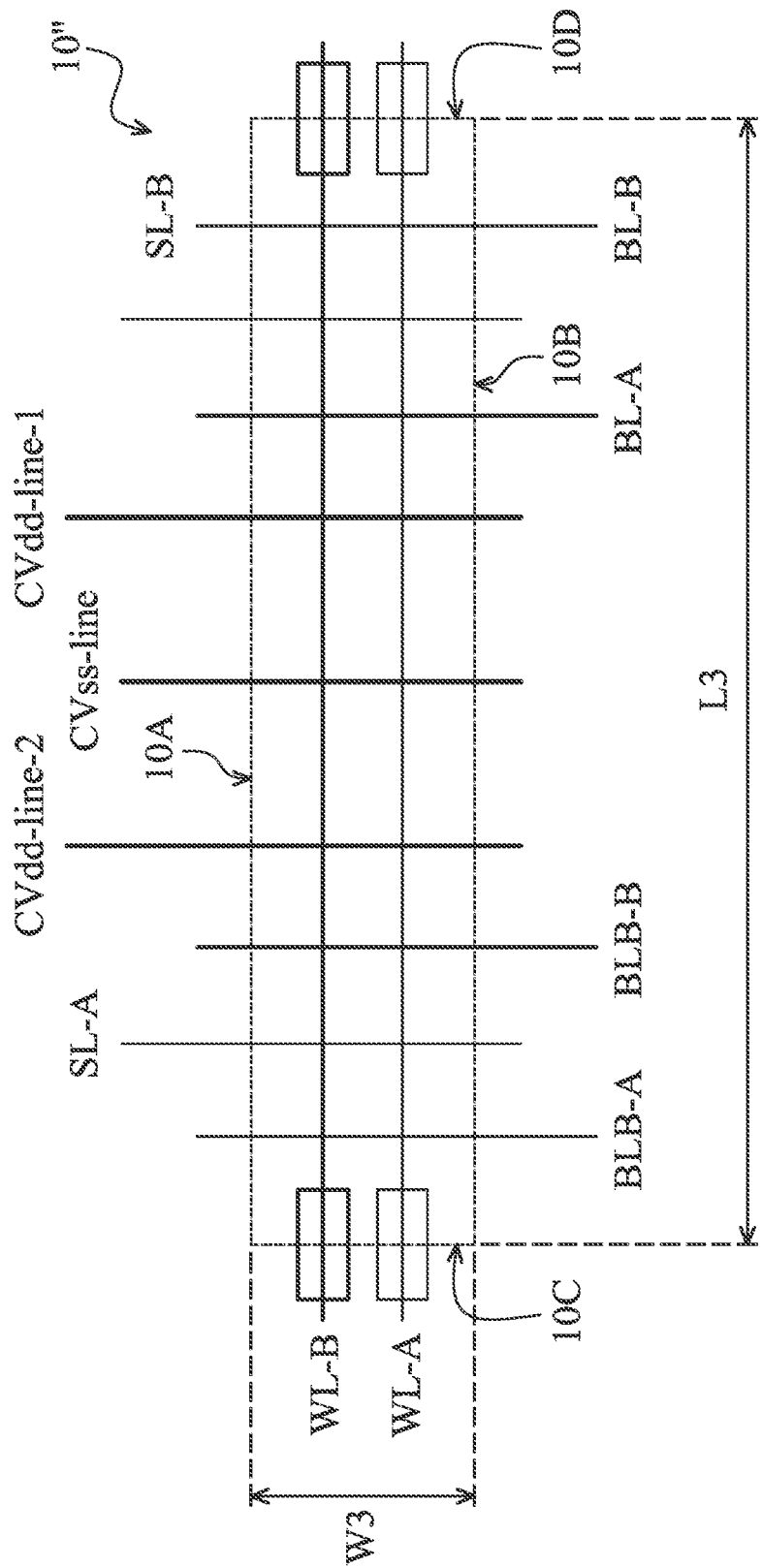
FIGS. 20 and 21 illustrate layouts of the dual-port SRAM cell in accordance with exemplary embodiments.
Figure 21:
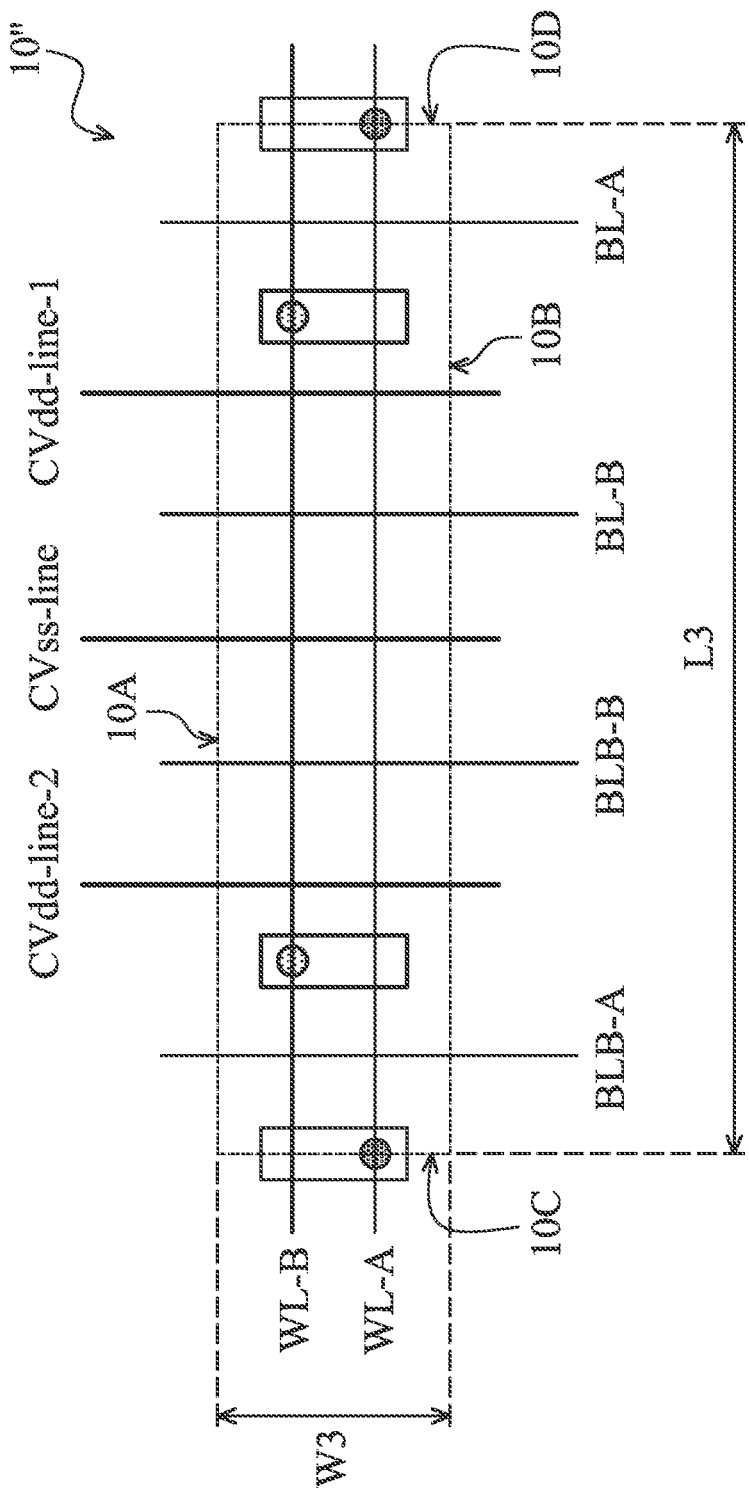

FIGS. 20 and 21 illustrate the layouts of the metal lines in dual-port SRAM cell 10" in accordance with exemplary embodiments. In accordance with these embodiments, as shown in FIG. 20, line CVss-line is located between line CVdd-line-1 and CVdd-line-2. Bit-lines BL-B, BLB-B, BLB-A, and BL-A and are disposed on the outer sides of lines CVss-line, BL-B, and BLB-B. In some embodiments, lines CVss-line, CVdd-line-1, and CVdd-line-2, and bit-lines BLB-A, BLB-B, BL-A, and BL-B are in metal layer M1 (FIG. 4). Word-lines WL-A and WL-B may be allocated in metal layer M2 (FIG. 4) in accordance with some embodiments. Shielding lines SL-A and SL-B may also be allocated to be parallel to CVss-line, and may be connected to a constant voltage, such as VDD or VSS. Shielding lines SL-A and SL-B may also be in metal layer M1.

The layout in FIG. 21 is similar to the layout in FIG. 20, except that shielding lines SL-A and SL-B are not formed, and line CVdd-line-2 is disposed between bit-lines BLB-A and BLB-B, and line CVdd-line-1 is disposed between bit-lines BL-A and BL-B. Although not shown in FIGS. 20 and 21, the layout of SRAM cell 10" may also include a P-well region between two N-well regions, similar to FIG. 5, for example.

In accordance with the exemplary embodiments of the present disclosure, by adopting p-type pass-gate FinFETs, strong drive currents Ion can be obtained, and the speed of the respective SRAM cell is improved. The embodiments have good resistance to alpha-particle induced errors. The raised SiGe epitaxy regions for the source and drain regions of the FinFETs in the SRAM cells may result in a low contact resistance, and hence the drive currents Ion are further boosted. The landing margin for the contact plugs to land on the source and drain regions is also improved by using raised SiGe epitaxy regions.

In accordance with some embodiments, an SRAM cell includes a first long boundary and a second long boundary parallel to a first direction, and a first short boundary and a second short boundary parallel to a second direction perpendicular to the first direction. The first and the second long boundaries are longer than, and form a rectangle with, the first and the second short boundaries. A CVss line carrying a VSS power supply voltage crosses the first long boundary and the second long boundary. The CVss line is parallel to the second direction. A bit-line and a bit-line bar are on opposite sides of the CVss line. The bit-line and the bit-line bar are configured to carry complementary bit-line signals.

In accordance with other embodiments, an SRAM cell includes a p-well region, and a first and a second n-well region on opposite sides of the p-well region. A CVss line carrying a VSS power supply voltage is over the p-well region, wherein the CVss line is parallel to an interface between the p-well region and the first n-well region. A first pull-up FinFET and a second pull-up FinFET are in the first n-well region and the second n-well region, respectively. A first pull-down FinFET and a second pull-down FinFET are in the p-well region. A first pass-gate FinFET and a second pass-gate FinFET are in the first n-well region and the second n-well region, respectively.

In accordance with yet other embodiments, an SRAM cell includes a p-well region, a first n-well region and a second n-well region on opposite sides of the p-well region, and a long boundary and a short boundary, with the short boundary shorter than the long boundary. A CVss line carrying a VSS power supply voltage overlaps the p-well region, wherein the CVss line is parallel to the short boundary. A bit-line and a bit-line bar are on opposite sides of the CVss line. The bit-line and the bit-line bar are configured to carry complementary bit-line signals. The bit-line and the bit-line bar overlap the first n-well region and the second well-region, respectively. A first pull-up Fin FinFET and a second pull-up FinFET are in the first n-well region and the second n-well region, respectively. A first pull-down FinFET and a second pull-down FinFET are in the p-well region. A first pass-gate FinFET and a second pass-gate FinFET are in the first n-well region and the second n-well region, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A Static Random Access Memory (SRAM) cell comprising:
    a first long boundary and a second long boundary parallel to a first direction;
    a first short boundary and a second short boundary parallel to a second direction perpendicular to the first direction, wherein the first and the second long boundaries are longer than, and form a rectangle with, the first and the second short boundaries;
    a CVss line carrying a VSS power supply voltage crossing the first long boundary and the second long boundary, wherein the CVss line is parallel to the second direction;
    a bit-line and a bit-line bar on opposite sides of the CVss line, wherein the bit-line and the bit-line bar are configured to carry complementary bit-line signals;
    a word-line parallel to the first direction; and a first CVdd line and a second CVdd line parallel to the first direction and on opposite sides of the word-line, wherein the first CVdd line and the second CVdd line are configured to carry a positive power supply voltage.

2. The SRAM cell of claim 1, wherein the CVss line is wider than the bit-line and the bit-line bar.

3. The SRAM cell of claim 1, wherein a ratio of a length of the first long boundary to a length of the first short boundary is greater than about 2.

4. The SRAM cell of claim 1 further comprising:
a p-well region in a center region of the SRAM cell, wherein the CVss line overlaps the p-well region; and
a first and a second n-well region on opposite sides of the p-well region.

5. The SRAM cell of claim 4 further comprising:
a first pull-up Fin Field-Effect Transistor (FinFET) and a second pull-up FinFET formed on the first and the second n-well regions, respectively;
a first pull-down FinFET and a second pull-down FinFET formed on the p-well region; and
a first and a second pass-gate FinFET formed on the first and the second n-well regions, respectively.

6. A Static Random Access Memory (SRAM) cell comprising:
a p-well region;
a first and a second n-well region on opposite sides of the p-well region;
a CVss line carrying a VSS power supply voltage over the p-well region, wherein the CVss line is parallel to an interface between the p-well region and the first n-well region;
a word-line perpendicular to the interface;
a first CVdd line and a second CVdd line perpendicular to the interface and on opposite sides of the word-line, wherein the first CVdd line and the second CVdd line are configured to carry a positive power supply voltage;
a first pull-up Fin Field-Effect Transistor (FinFET) and a second pull-up FinFET in the first n-well region and the second n-well region, respectively;
a first pull-down FinFET and a second pull-down FinFET in the p-well region; and
a first pass-gate FinFET and a second pass-gate FinFET in the first n-well region and the second n-well region, respectively.

7. The SRAM cell of claim 6 further comprising a bit-line and a bit-line bar on opposite sides of the CVss line, wherein the bit-line and a bit-line bar are configured to carry complementary bit-line signals.

8. The SRAM cell of claim 6 further comprising a long boundary and a short boundary, with the short boundary shorter than the long boundary, wherein the CVss line is parallel to the short boundary.

9. The SRAM cell of claim 8, wherein a length of the long boundary to a length of the short boundary is greater than about 2.

10. The SRAM cell of claim 6 further comprising:
a third pull-up FinFET comprising a gate connected to gates of the first pull-up FinFET and the first pull-down FinFET;
a third pass-gate FinFET cascaded with the third pull-up FinFET; and
a read word-line connected to a gate of the third pass-gate FinFET.

11. The SRAM cell of claim 6 further comprising a third pass-gate FinFET and a fourth pass-gate FinFET, wherein the first pass-gate FinFET and the second pass-gate FinFET form a portion of a first port of the SRAM cell, and wherein the third pass-gate FinFET and the fourth pass-gate FinFET form a portion of a second port of the SRAM cell.

12. A Static Random Access Memory (SRAM) cell comprising:
a p-well region;
a first n-well region and a second n-well region on opposite sides of the p-well region;
a long boundary and a short boundary, with the short boundary shorter than the long boundary;
a CVss line carrying a VSS power supply voltage overlapping the p-well region, wherein the CVss line is parallel to the short boundary;
a bit-line and a bit-line bar on opposite sides of the CVss line, wherein the bit-line and the bit-line bar are configured to carry complementary bit-line signals, and wherein the bit-line and the bit-line bar overlap the first n-well region and the second n-well region, respectively;
a word-line parallel to the long boundary;
a first CVdd line and a second CVdd line parallel to the long boundary and on opposite sides of the word-line, wherein the first CVdd line and the second CVdd line are configured to carry a positive power supply voltage;
a first pull-up Fin Field-Effect Transistor (FinFET) and a second pull-up FinFET in the first n-well region and the second n-well region, respectively;
a first pull-down FinFET and a second pull-down FinFET in the p-well region; and
a first pass-gate FinFET and a second pass-gate FinFET in the first n-well region and the second n-well region, respectively.

13. The SRAM cell of claim 12, wherein a length of the long boundary to a length of the short boundary is greater than about 2.

14. The SRAM cell of claim 1, wherein the SRAM cell is a six-transistor (6T) SRAM cells.

15. The SRAM cell of claim 6, wherein the SRAM cell is a six-transistor (6T) SRAM cells.

16. The SRAM cell of claim 12, wherein the SRAM cell is a six-transistor (6T) SRAM cells.

* * * * *